United States Patent
Anthony et al.

(10) Patent No.: US 7,262,949 B2
(45) Date of Patent: * Aug. 28, 2007

(54) ELECTRODE ARRANGEMENT FOR CIRCUIT ENERGY CONDITIONING

(75) Inventors: Anthony A. Anthony, Erie, PA (US); William M. Anthony, Erie, PA (US)

(73) Assignee: X2Y Attenuators, LLC, Erie, PA (US)

( * ) Notice: Subject to any disclaimer, the term of this patent is extended or adjusted under 35 U.S.C. 154(b) by 688 days.

This patent is subject to a terminal disclaimer.

(21) Appl. No.: 10/344,749

(22) PCT Filed: Aug. 14, 2001

(86) PCT No.: PCT/US01/41720

§ 371 (c)(1),
(2), (4) Date: May 30, 2003

(87) PCT Pub. No.: WO02/15360

PCT Pub. Date: Feb. 21, 2002

(65) Prior Publication Data

US 2004/0004802 A1    Jan. 8, 2004

Related U.S. Application Data

(60) Provisional application No. 60/225,497, filed on Aug. 15, 2000.

(51) Int. Cl.
*H02H 9/00* (2006.01)

(52) U.S. Cl. .................................................. 361/118
(58) Field of Classification Search ................. 361/118
See application file for complete search history.

(56) References Cited

U.S. PATENT DOCUMENTS 3,240,621 A    3/1966 Flower, Jr. et al.

(Continued)

FOREIGN PATENT DOCUMENTS

DE    197 28 692 A1    1/1999

(Continued)

OTHER PUBLICATIONS

PCT International Search Report for PCT/US01/48861, Oct. 1, 2002.

(Continued)

*Primary Examiner*—Stephen W. Jackson
(74) *Attorney, Agent, or Firm*—Neifeld IP Law, PC

(57) ABSTRACT

A predetermined electrode arrangement (1/1, 1/2, 1/3A, 1/6) comprising a plurality of shielded electrodes (213, 215) and a plurality of shielding electrodes (204, 214, 269A, 269B,) that together with other conductive (799, 206, 208, 207, 203, 218, 216, 217, 218) semi-conductive (not shown) and/or non-conductive material elements (212) are formed into a multi-functional energy condition assembly (1-1, 1-2, 1-3A, 1-6) or variant to be selectively coupled into circuitry (4-1, 5-1, 1-2).

20 Claims, 3 Drawing Sheets

U.S. PATENT DOCUMENTS

| | | |
|---|---|---|
| 3,343,034 A | 9/1967 | Ovshinsky |
| 3,573,677 A | 4/1971 | Detar |
| 3,736,471 A | 5/1973 | Donze et al. |
| 3,742,420 A | 6/1973 | Harnden, Jr. |
| 3,790,858 A | 2/1974 | Brancaleone et al. |
| 3,842,374 A | 10/1974 | Schlicke |
| 4,023,071 A | 5/1977 | Fussell |
| 4,119,084 A | 10/1978 | Eckels |
| 4,135,132 A | 1/1979 | Tafjord |
| 4,139,783 A | 2/1979 | Engeler |
| 4,191,986 A | 3/1980 | ta Huang et al. |
| 4,198,613 A | 4/1980 | Whitley |
| 4,259,604 A | 3/1981 | Aoki |
| 4,262,317 A | 4/1981 | Baumbach |
| 4,275,945 A | 6/1981 | Krantz et al. |
| 4,292,558 A | 9/1981 | Flick et al. |
| 4,308,509 A | 12/1981 | Tsuchiya et al. |
| 4,320,364 A | 3/1982 | Sakamoto et al. |
| 4,335,417 A | 6/1982 | Sakshaug et al. |
| 4,353,044 A | 10/1982 | Nossek |
| 4,366,456 A | 12/1982 | Ueno et al. |
| 4,384,263 A | 5/1983 | Neuman et al. |
| 4,394,639 A | 7/1983 | McGalliard |
| 4,412,146 A | 10/1983 | Futterer et al. |
| 4,494,092 A | 1/1985 | Griffin et al. |
| 4,533,931 A | 8/1985 | Mandai et al. |
| 4,553,114 A | 11/1985 | English et al. |
| 4,563,659 A | 1/1986 | Sakamoto |
| 4,586,104 A | 4/1986 | Standler |
| 4,587,589 A | 5/1986 | Marek |
| 4,590,537 A | 5/1986 | Sakamoto |
| 4,592,606 A | 6/1986 | Mudra |
| 4,612,140 A | 9/1986 | Mandai et al. |
| 4,612,497 A | 9/1986 | Ulmer |
| 4,636,752 A | 1/1987 | Saito |
| 4,682,129 A | 7/1987 | Bakermans et al. |
| 4,685,025 A | 8/1987 | Carlomagno |
| 4,688,151 A | 8/1987 | Kraus et al. |
| 4,694,265 A | 9/1987 | Kupper |
| 4,698,721 A | 10/1987 | Warren |
| 4,703,386 A | 10/1987 | Speet et al. |
| 4,712,540 A | 12/1987 | Takamine |
| 4,713,540 A | 12/1987 | Gilby et al. |
| 4,720,760 A | 1/1988 | Starr |
| 4,746,557 A | 5/1988 | Sakamoto et al. |
| 4,752,752 A | 6/1988 | Okubo |
| 4,760,485 A | 7/1988 | Ari et al. |
| 4,772,225 A | 9/1988 | Ulery |
| 4,777,460 A | 10/1988 | Okubo |
| 4,780,598 A | 10/1988 | Fahey et al. |
| 4,782,311 A | 11/1988 | Ookubo |
| 4,789,847 A | 12/1988 | Sakamoto et al. |
| 4,793,058 A | 12/1988 | Venaleck |
| 4,794,485 A | 12/1988 | Bennett |
| 4,794,499 A | 12/1988 | Ott |
| 4,795,658 A | 1/1989 | Kano et al. |
| 4,799,070 A | 1/1989 | Nishikawa |
| 4,801,904 A | 1/1989 | Sakamoto et al. |
| 4,814,295 A | 3/1989 | Mehta |
| 4,814,938 A | 3/1989 | Arakawa et al. |
| 4,814,941 A | 3/1989 | Speet et al. |
| 4,819,126 A | 4/1989 | Kornrumpf et al. |
| 4,845,606 A | 7/1989 | Herbert |
| 4,847,730 A | 7/1989 | Konno et al. |
| 4,904,967 A | 2/1990 | Morii et al. |
| 4,908,586 A | 3/1990 | Kling et al. |
| 4,908,590 A | 3/1990 | Sakamoto et al. |
| 4,924,340 A | 5/1990 | Sweet |
| 4,942,353 A | 7/1990 | Herbert et al. |
| 4,967,315 A | 10/1990 | Schelhorn |
| 4,978,906 A | 12/1990 | Herbert et al. |
| 4,990,202 A | 2/1991 | Murata et al. |
| 4,999,595 A | 3/1991 | Azumi et al. |
| 5,029,062 A | 7/1991 | Capel |
| 5,034,709 A | 7/1991 | Azumi et al. |
| 5,034,710 A | 7/1991 | Kawaguchi |
| 5,051,712 A | 9/1991 | Naito et al. |
| 5,059,140 A | 10/1991 | Philippson et al. |
| 5,065,284 A | 11/1991 | Hernandez |
| 5,073,523 A | 12/1991 | Yamada et al. |
| 5,079,069 A | 1/1992 | Howard et al. |
| 5,079,223 A | 1/1992 | Maroni |
| 5,079,669 A | 1/1992 | Williams |
| 5,089,688 A | 2/1992 | Fang et al. |
| 5,105,333 A | 4/1992 | Yamano et al. |
| 5,107,394 A | 4/1992 | Naito et al. |
| 5,109,206 A | 4/1992 | Carlile |
| 5,140,297 A | 8/1992 | Jacobs et al. |
| 5,140,497 A | 8/1992 | Kato et al. |
| 5,142,430 A | 8/1992 | Anthony |
| 5,148,005 A | 9/1992 | Fang et al. |
| 5,155,655 A | 10/1992 | Howard et al. |
| 5,161,086 A | 11/1992 | Howard et al. |
| 5,167,483 A | 12/1992 | Gardiner |
| 5,173,670 A | 12/1992 | Naito et al. |
| 5,179,362 A | 1/1993 | Okochi et al. |
| 5,181,859 A | 1/1993 | Foreman et al. |
| 5,186,647 A | 2/1993 | Denkmann et al. |
| 5,208,502 A | 5/1993 | Yamashita et al. |
| 5,219,812 A | 6/1993 | Doi et al. |
| 5,220,480 A | 6/1993 | Kershaw, Jr. et al. |
| 5,236,376 A | 8/1993 | Cohen |
| 5,243,308 A | 9/1993 | Shusterman et al. |
| 5,251,092 A | 10/1993 | Brady et al. |
| 5,257,950 A | 11/1993 | Lenker et al. |
| 5,261,153 A | 11/1993 | Lucas |
| 5,262,611 A | 11/1993 | Danysh et al. |
| 5,268,810 A | 12/1993 | DiMarco et al. |
| 5,290,191 A | 3/1994 | Foreman et al. |
| 5,299,956 A | 4/1994 | Brownell et al. |
| 5,300,760 A | 4/1994 | Batliwalla et al. |
| 5,310,363 A | 5/1994 | Brownell et al. |
| 5,311,408 A | 5/1994 | Ferchau et al. |
| 5,321,373 A | 6/1994 | Shusterman et al. |
| 5,321,573 A | 6/1994 | Person et al. |
| 5,326,284 A | 7/1994 | Bohbot et al. |
| 5,337,028 A | 8/1994 | White |
| 5,353,189 A | 10/1994 | Tomlinson |
| 5,353,202 A | 10/1994 | Ansell et al. |
| 5,357,568 A | 10/1994 | Pelegris |
| 5,362,249 A | 11/1994 | Carter |
| 5,362,254 A | 11/1994 | Siemon et al. |
| 5,378,407 A | 1/1995 | Chandler et al. |
| 5,382,928 A | 1/1995 | Davis et al. |
| 5,382,938 A | 1/1995 | Hansson et al. |
| 5,386,335 A | 1/1995 | Amano et al. |
| 5,396,201 A | 3/1995 | Ishizaki et al. |
| 5,401,952 A | 3/1995 | Sugawa |
| 5,405,466 A | 4/1995 | Naito et al. |
| 5,414,393 A | 5/1995 | Rose et al. |
| 5,414,587 A | 5/1995 | Kiser et al. |
| 5,420,553 A | 5/1995 | Sakamoto et al. |
| 5,432,484 A | 7/1995 | Klas et al. |
| 5,446,625 A | 8/1995 | Urbish et al. |
| 5,450,278 A | 9/1995 | Lee et al. |
| 5,451,919 A | 9/1995 | Chu et al. |
| RE35,064 E | 10/1995 | Hernandez |
| 5,455,734 A | 10/1995 | Foreman et al. |
| 5,461,351 A | 10/1995 | Shusterman |
| 5,463,232 A | 10/1995 | Yamashita et al. |
| 5,471,035 A | 11/1995 | Holmes |
| 5,477,933 A | 12/1995 | Nguyen |
| 5,481,238 A | 1/1996 | Carsten et al. |
| 5,483,407 A | 1/1996 | Anastasio et al. |

| | | | | | |
|---|---|---|---|---|---|
| 5,488,540 A | 1/1996 | Hatta | 5,959,846 A | 9/1999 | Noguchi et al. |
| 5,491,299 A | 2/1996 | Naylor et al. | 5,969,461 A | 10/1999 | Anderson et al. |
| 5,493,260 A | 2/1996 | Park | 5,977,845 A | 11/1999 | Kitahara |
| 5,495,180 A | 2/1996 | Huang et al. | 5,978,231 A | 11/1999 | Tohya et al. |
| 5,500,629 A | 3/1996 | Meyer | 5,980,718 A | 11/1999 | Van Konynenburg et al. |
| 5,500,785 A | 3/1996 | Funada | 5,995,352 A | 11/1999 | Gumley |
| 5,512,196 A | 4/1996 | Mantese et al. | 5,999,067 A | 12/1999 | D"Ostilio |
| 5,531,003 A | 7/1996 | Seifried et al. | 5,999,398 A | 12/1999 | Makl et al. |
| 5,534,837 A | 7/1996 | Brandt | 6,004,752 A | 12/1999 | Loewy et al. |
| 5,535,101 A | 7/1996 | Miles et al. | 6,013,957 A | 1/2000 | Puzo et al. |
| 5,536,978 A | 7/1996 | Cooper et al. | 6,016,095 A | 1/2000 | Herbert |
| 5,541,482 A | 7/1996 | Siao | 6,018,448 A | 1/2000 | Anthony |
| 5,544,002 A | 8/1996 | Iwaya et al. | 6,021,564 A | 2/2000 | Hanson |
| 5,546,058 A | 8/1996 | Azuma et al. | 6,023,406 A | 2/2000 | Kinoshita et al. |
| 5,548,255 A | 8/1996 | Spielman | 6,031,710 A | 2/2000 | Wolf et al. |
| 5,555,150 A | 9/1996 | Newman, Jr. | 6,034,576 A | 3/2000 | Kuth |
| 5,568,348 A | 10/1996 | Foreman et al. | 6,034,864 A | 3/2000 | Naito et al. |
| 5,570,278 A | 10/1996 | Cross | 6,037,846 A | 3/2000 | Oberhammer |
| 5,583,359 A | 12/1996 | Ng et al. | 6,038,121 A | 3/2000 | Naito et al. |
| 5,586,007 A | 12/1996 | Funada | 6,042,685 A | 3/2000 | Shinada et al. |
| 5,592,391 A | 1/1997 | Muyshondt et al. | 6,046,898 A | 4/2000 | Seymour et al. |
| 5,612,657 A | 3/1997 | Kledzik | 6,052,038 A | 4/2000 | Savicki |
| 5,614,881 A | 3/1997 | Duggal et al. | 6,061,227 A | 5/2000 | Nogi |
| 5,619,079 A | 4/1997 | Wiggins et al. | 6,064,286 A | 5/2000 | Ziegner et al. |
| 5,624,592 A | 4/1997 | Paustian | 6,072,687 A | 6/2000 | Naito et al. |
| 5,640,048 A | 6/1997 | Selna | 6,075,211 A | 6/2000 | Tohya et al. |
| 5,645,746 A | 7/1997 | Walsh | 6,078,117 A | 6/2000 | Perrin et al. |
| 5,647,766 A | 7/1997 | Nguyen | 6,078,229 A | 6/2000 | Funada et al. |
| 5,647,767 A | 7/1997 | Scheer et al. | 6,088,235 A | 7/2000 | Chiao et al. |
| 5,668,511 A | 9/1997 | Furutani et al. | 6,091,310 A | 7/2000 | Utsumi et al. |
| 5,682,303 A | 10/1997 | Goad | 6,092,269 A | 7/2000 | Yializis et al. |
| 5,692,298 A | 12/1997 | Goetz et al. | 6,094,112 A | 7/2000 | Goldberger et al. |
| 5,700,167 A | 12/1997 | Pharney et al. | 6,094,339 A | 7/2000 | Evans |
| 5,708,553 A | 1/1998 | Hung | 6,097,260 A | 8/2000 | Whybrew et al. |
| 5,719,450 A | 2/1998 | Vora | 6,097,581 A | 8/2000 | Anthony |
| 5,719,477 A | 2/1998 | Tomihari | 6,104,258 A | 8/2000 | Novak |
| 5,719,750 A | 2/1998 | Iwane | 6,104,599 A | 8/2000 | Ahiko et al. |
| 5,751,539 A | 5/1998 | Stevenson et al. | 6,108,448 A | 8/2000 | Song et al. |
| 5,767,446 A | 6/1998 | Ha et al. | 6,111,479 A | 8/2000 | Myohga et al. |
| 5,789,999 A | 8/1998 | Barnett et al. | 6,120,326 A | 9/2000 | Brooks |
| 5,790,368 A | 8/1998 | Naito et al. | 6,121,761 A | 9/2000 | Herbert |
| 5,796,568 A | 8/1998 | Baiatu | 6,125,044 A | 9/2000 | Cherniski et al. |
| 5,796,595 A | 8/1998 | Cross | 6,130,585 A | 10/2000 | Whybrew et al. |
| 5,797,770 A | 8/1998 | Davis et al. | 6,137,392 A | 10/2000 | Herbert |
| 5,808,873 A | 9/1998 | Celaya et al. | 6,142,831 A | 11/2000 | Ashman et al. |
| 5,825,084 A | 10/1998 | Lau et al. | 6,144,547 A | 11/2000 | Retseptor |
| 5,825,628 A | 10/1998 | Garbelli et al. | 6,147,587 A | 11/2000 | Hadano et al. |
| 5,828,093 A | 10/1998 | Naito et al. | 6,150,895 A | 11/2000 | Steigerwald et al. |
| 5,828,272 A | 10/1998 | Romerein et al. | 6,157,528 A | 12/2000 | Anthony |
| 5,828,555 A | 10/1998 | Itoh | 6,157,547 A | 12/2000 | Brown et al. |
| 5,831,489 A | 11/1998 | Wire | 6,160,705 A | 12/2000 | Stearns et al. |
| 5,834,992 A | 11/1998 | Kato et al. | 6,163,454 A | 12/2000 | Strickler |
| 5,838,216 A | 11/1998 | White et al. | 6,163,456 A | 12/2000 | Suzuki et al. |
| 5,867,361 A | 2/1999 | Wolf et al. | 6,165,814 A | 12/2000 | Wark et al. |
| 5,870,272 A | 2/1999 | Seifried et al. | 6,175,287 B1 | 1/2001 | Lampen et al. |
| 5,875,099 A | 2/1999 | Maesaka et al. | 6,180,588 B1 | 1/2001 | Walters |
| 5,880,925 A | 3/1999 | DuPre et al. | 6,181,231 B1 | 1/2001 | Bartilson |
| 5,889,445 A | 3/1999 | Ritter et al. | 6,183,685 B1 | 2/2001 | Cowman et al. |
| 5,895,990 A | 4/1999 | Lau | 6,185,091 B1 | 2/2001 | Tanahashi et al. |
| 5,898,403 A | 4/1999 | Saitoh et al. | 6,188,565 B1 | 2/2001 | Naito et al. |
| 5,898,562 A | 4/1999 | Cain et al. | 6,191,475 B1 | 2/2001 | Skinner et al. |
| 5,905,627 A | 5/1999 | Brendel et al. | 6,191,669 B1 | 2/2001 | Shigemura |
| 5,907,265 A | 5/1999 | Sakuragawa et al. | 6,191,932 B1 | 2/2001 | Kuroda et al. |
| 5,908,151 A | 6/1999 | Elias | 6,195,269 B1 | 2/2001 | Hino |
| 5,909,155 A | 6/1999 | Anderson et al. | 6,198,123 B1 | 3/2001 | Linder et al. |
| 5,909,350 A | 6/1999 | Anthony | 6,198,362 B1 | 3/2001 | Harada et al. |
| 5,910,755 A | 6/1999 | Mishiro et al. | 6,204,448 B1 | 3/2001 | Garland et al. |
| 5,912,809 A | 6/1999 | Steigerwald et al. | 6,205,014 B1 | 3/2001 | Inomata et al. |
| 5,917,388 A | 6/1999 | Tronche et al. | 6,207,081 B1 | 3/2001 | Sasaki et al. |
| 5,926,377 A | 7/1999 | Nakao et al. | 6,208,063 B1 | 3/2001 | Horikawa |
| 5,928,076 A | 7/1999 | Clements et al. | 6,208,225 B1 | 3/2001 | Miller |
| 5,955,930 A | 9/1999 | Anderson et al. | 6,208,226 B1 | 3/2001 | Chen et al. |
| 5,959,829 A | 9/1999 | Stevenson et al. | 6,208,494 B1 | 3/2001 | Nakura et al. |

| | | | | | | |
|---|---|---|---|---|---|---|
| 6,208,495 | B1 | 3/2001 | Wieloch et al. | 6,806,806 | B2 | 10/2004 | Anthony |
| 6,208,501 | B1 | 3/2001 | Ingalls et al. | 6,873,513 | B2 | 3/2005 | Anthony |
| 6,208,502 | B1 | 3/2001 | Hudis et al. | 6,894,884 | B2 | 5/2005 | Anthony, Jr. et al. |
| 6,208,503 | B1 | 3/2001 | Shimada et al. | 6,950,293 | B2 | 9/2005 | Anthony |
| 6,208,521 | B1 | 3/2001 | Nakatsuka | 6,954,346 | B2 | 10/2005 | Anthony |
| 6,208,525 | B1 | 3/2001 | Imasu et al. | 6,995,983 | B1 | 2/2006 | Anthony et al. |
| 6,211,754 | B1 | 4/2001 | Nishida et al. | 7,042,303 | B2 | 5/2006 | Anthony et al. |
| 6,212,078 | B1 | 4/2001 | Hunt et al. | 7,042,703 | B2 | 5/2006 | Anthony et al. |
| 6,215,647 | B1 | 4/2001 | Naito et al. | 7,050,284 | B2 | 5/2006 | Anthony |
| 6,215,649 | B1 | 4/2001 | Appelt et al. | 7,106,570 | B2 | 9/2006 | Anthony, Jr. et al. |
| 6,218,631 | B1 | 4/2001 | Hetzel et al. | 7,110,227 | B2 | 9/2006 | Anthony et al. |
| 6,219,240 | B1 | 4/2001 | Sasov | 7,110,235 | B2 | 9/2006 | Anthony, Jr. et al. |
| 6,222,427 | B1 | 4/2001 | Kato et al. | 7,113,383 | B2 | 9/2006 | Anthony et al. |
| 6,222,431 | B1 | 4/2001 | Ishizaki et al. | 7,141,899 | B2 | 11/2006 | Anthony et al. |
| 6,225,876 | B1 | 5/2001 | Akino et al. | 7,180,718 | B2 | 2/2007 | Anthony et al. |
| 6,226,169 | B1 | 5/2001 | Naito et al. | 2001/0001989 | A1 | 5/2001 | Smith |
| 6,226,182 | B1 | 5/2001 | Maehara | 2001/0002105 | A1 | 5/2001 | Brandelik et al. |
| 6,229,226 | B1 | 5/2001 | Kramer et al. | 2001/0002624 | A1 | 6/2001 | Khandros et al. |
| 6,236,572 | B1 | 5/2001 | Teshome et al. | 2001/0008288 | A1 | 7/2001 | Kimura et al. |
| 6,240,621 | B1 | 6/2001 | Nellissen et al. | 2001/0008302 | A1 | 7/2001 | Murakami et al. |
| 6,243,253 | B1 | 6/2001 | DuPre et al. | 2001/0008478 | A1 | 7/2001 | McIntosh et al. |
| 6,249,047 | B1 | 6/2001 | Corisis | 2001/0008509 | A1 | 7/2001 | Watanabe |
| 6,249,439 | B1 | 6/2001 | DeMore et al. | 2001/0009496 | A1 | 7/2001 | Kappel et al. |
| 6,252,161 | B1 | 6/2001 | Hailey et al. | 2001/0010444 | A1 | 8/2001 | Pahl et al. |
| 6,262,895 | B1 | 7/2001 | Forthun | 2001/0011763 | A1 | 8/2001 | Ushijima et al. |
| 6,266,228 | B1 | 7/2001 | Naito et al. | 2001/0011934 | A1 | 8/2001 | Yamamoto |
| 6,266,229 | B1 | 7/2001 | Naito et al. | 2001/0011937 | A1 | 8/2001 | Satoh et al. |
| 6,272,003 | B1 | 8/2001 | Schaper | 2001/0013626 | A1 | 8/2001 | Fujii |
| 6,281,704 | B2 | 8/2001 | Ngai et al. | 2001/0015643 | A1 | 8/2001 | Goldfine et al. |
| 6,282,074 | B1 | 8/2001 | Anthony | 2001/0015683 | A1 | 8/2001 | Mikami et al. |
| 6,282,079 | B1 | 8/2001 | Nagakari et al. | 2001/0017576 | A1 | 8/2001 | Kondo et al. |
| 6,285,109 | B1 | 9/2001 | Katagiri et al. | 2001/0017579 | A1 | 8/2001 | Kurata |
| 6,285,542 | B1 | 9/2001 | Kennedy, III et al. | 2001/0019869 | A1 | 9/2001 | Hsu |
| 6,292,350 | B1 | 9/2001 | Naito et al. | 2001/0020879 | A1 | 9/2001 | Takahashi et al. |
| 6,292,351 | B1 | 9/2001 | Ahiko et al. | 2001/0021097 | A1 | 9/2001 | Ohya et al. |
| 6,309,245 | B1 | 10/2001 | Sweeney | 2001/0022547 | A1 | 9/2001 | Murata et al. |
| 6,310,286 | B1 | 10/2001 | Troxel et al. | 2001/0023983 | A1 | 9/2001 | Kobayashi et al. |
| 6,313,584 | B1 | 11/2001 | Johnson et al. | 2001/0024148 | A1 | 9/2001 | Gerstenberg et al. |
| 6,320,547 | B1 | 11/2001 | Fathy et al. | 2001/0028581 | A1 | 10/2001 | Yanagisawa et al. |
| 6,324,047 | B1 | 11/2001 | Hayworth | 2001/0029648 | A1 | 10/2001 | Ikada et al. |
| 6,324,048 | B1 | 11/2001 | Liu | 2001/0031191 | A1 | 10/2001 | Korenaga |
| 6,325,672 | B1 | 12/2001 | Belopolsky et al. | 2001/0033664 | A1 | 10/2001 | Poux et al. |
| 6,327,134 | B1 | 12/2001 | Kuroda et al. | 2001/0035801 | A1 | 11/2001 | Gilbert |
| 6,327,137 | B1 | 12/2001 | Yamamoto et al. | 2001/0035802 | A1 | 11/2001 | Kadota |
| 6,331,926 | B1 | 12/2001 | Anthony | 2001/0035805 | A1 | 11/2001 | Suzuki et al. |
| 6,331,930 | B1 | 12/2001 | Kuroda | 2001/0037680 | A1 | 11/2001 | Buck et al. |
| 6,342,681 | B1 | 1/2002 | Goldberger et al. | 2001/0039834 | A1 | 11/2001 | Hsu |
| 6,373,673 | B1 | 4/2002 | Anthony | 2001/0040484 | A1 | 11/2001 | Kim |
| 6,388,856 | B1 | 5/2002 | Anthony | 2001/0040487 | A1 | 11/2001 | Ikata et al. |
| 6,395,996 | B1 | 5/2002 | Tsai et al. | 2001/0040488 | A1 | 11/2001 | Gould et al. |
| 6,448,873 | B1 | 9/2002 | Mostov | 2001/0041305 | A1 | 11/2001 | Sawada et al. |
| 6,456,481 | B1 | 9/2002 | Stevenson | 2001/0043100 | A1 | 11/2001 | Tomita et al. |
| 6,469,595 | B2 | 10/2002 | Anthony et al. | 2001/0043129 | A1 | 11/2001 | Hidaka et al. |
| 6,498,710 | B1 | 12/2002 | Anthony | 2001/0043450 | A1 | 11/2001 | Seale et al. |
| 6,504,451 | B1 | 1/2003 | Yamaguchi | 2001/0043453 | A1 | 11/2001 | Narwankar et al. |
| 6,509,807 | B1 | 1/2003 | Anthony et al. | 2001/0045810 | A1 | 11/2001 | Poon et al. |
| 6,510,038 | B1 | 1/2003 | Satou et al. | 2001/0048581 | A1 | 12/2001 | Anthony et al. |
| 6,522,516 | B2 | 2/2003 | Anthony | 2001/0048593 | A1 | 12/2001 | Yamauchi et al. |
| 6,549,389 | B2 * | 4/2003 | Anthony et al. ............ 361/117 | 2001/0048906 | A1 | 12/2001 | Lau et al. |
| 6,563,688 | B2 | 5/2003 | Anthony et al. | 2001/0050550 | A1 | 12/2001 | Yoshida et al. |
| 6,580,595 | B2 | 6/2003 | Anthony et al. | 2001/0050600 | A1 | 12/2001 | Anthony et al. |
| 6,594,128 | B2 | 7/2003 | Anthony | 2001/0050837 | A1 | 12/2001 | Stevenson et al. |
| 6,603,372 | B1 | 8/2003 | Ishizaki et al. | 2001/0052833 | A1 | 12/2001 | Enokihara et al. |
| 6,603,646 | B2 | 8/2003 | Anthony et al. | 2001/0054512 | A1 | 12/2001 | Belau et al. |
| 6,606,011 | B2 | 8/2003 | Anthony et al. | 2001/0054734 | A1 | 12/2001 | Koh et al. |
| 6,606,237 | B1 | 8/2003 | Naito et al. | 2001/0054756 | A1 | 12/2001 | Horiuchi et al. |
| 6,618,268 | B2 | 9/2003 | Dibene, II et al. | 2001/0054936 | A1 | 12/2001 | Okada et al. |
| 6,636,406 | B1 | 10/2003 | Anthony | 2002/0000521 | A1 | 1/2002 | Brown |
| 6,650,525 | B2 | 11/2003 | Anthony | 2002/0000583 | A1 | 1/2002 | Kitsukawa et al. |
| 6,687,108 | B1 | 2/2004 | Anthony et al. | 2002/0000821 | A1 | 1/2002 | Haga et al. |
| 6,696,952 | B2 | 2/2004 | Zirbes | 2002/0000893 | A1 | 1/2002 | Hidaka et al. |
| 6,717,301 | B2 | 4/2004 | De Daran et al. | 2002/0000895 | A1 | 1/2002 | Takahashi et al. |
| 6,738,249 | B1 | 5/2004 | Anthony et al. | 2002/0003454 | A1 | 1/2002 | Sweeney et al. |

| | | | | | | |
|---|---|---|---|---|---|---|
| 2002/0005880 A1 | 1/2002 | Ashe et al. | | JP | 06-053049 | 2/1994 |
| 2002/0024787 A1 | 2/2002 | Anthony | | JP | 06-53049 | 2/1994 |
| 2002/0027263 A1 | 3/2002 | Anthony et al. | | JP | 06-053075 | 2/1994 |
| 2002/0027760 A1 | 3/2002 | Anthony | | JP | 06-053077 | 2/1994 |
| 2002/0044401 A1 | 4/2002 | Anthony et al. | | JP | 06-053078 | 2/1994 |
| 2002/0075096 A1 | 6/2002 | Anthony | | JP | 06-084695 | 3/1994 |
| 2002/0079116 A1 | 6/2002 | Anthony | | JP | 06-151014 | 5/1994 |
| 2002/0089812 A1 | 7/2002 | Anthony et al. | | JP | 06-151244 | 5/1994 |
| 2002/0113663 A1 | 8/2002 | Anthony et al. | | JP | 06-151245 | 5/1994 |
| 2002/0122286 A1 | 9/2002 | Anthony | | JP | 06-325977 | 11/1994 |
| 2002/0131231 A1 | 9/2002 | Anthony | | JP | 07-235406 | 9/1995 |
| 2002/0149900 A1 | 10/2002 | Anthony | | JP | 07-235852 | 9/1995 |
| 2002/0158515 A1 | 10/2002 | Anthony, Jr. et al. | | JP | 07-240651 | 9/1995 |
| 2002/0186100 A1 | 12/2002 | Anthony et al. | | JP | 08-124795 | 5/1996 |
| 2003/0029632 A1 | 2/2003 | Anthony, Jr. et al. | | JP | 08-163122 | 6/1996 |
| 2003/0029635 A1 | 2/2003 | Anthony, Jr. et al. | | JP | 06-172025 | 7/1996 |
| 2003/0048029 A1 | 3/2003 | DeDaran et al. | | JP | 08-172025 | 7/1996 |
| 2003/0067730 A1 | 4/2003 | Anthony et al. | | JP | 8172025 | 7/1996 |
| 2003/0161086 A1 | 8/2003 | Anthony | | JP | 09-232185 | 9/1997 |
| 2003/0202312 A1 | 10/2003 | Anthony et al. | | JP | 09-284077 | 10/1997 |
| 2003/0206388 A9 | 11/2003 | Anthony et al. | | JP | 09-284078 | 10/1997 |
| 2003/0210125 A1 | 11/2003 | Anthony | | JP | 9-294041 | 11/1997 |
| 2003/0231451 A1 | 12/2003 | Anthony | | JP | 11-21456 | 8/1999 |
| 2003/0231456 A1 | 12/2003 | Anthony et al. | | JP | 11-214256 | 8/1999 |
| 2004/0004802 A1 | 1/2004 | Anthony et al. | | JP | 11-223396 | 8/1999 |
| 2004/0008466 A1 | 1/2004 | Anthony et al. | | JP | 11-294908 | 10/1999 |
| 2004/0012949 A1 | 1/2004 | Anthony et al. | | JP | 11-305302 | 11/1999 |
| 2004/0027771 A1 | 2/2004 | Anthony | | JP | 11-319222 | 11/1999 |
| 2004/0032304 A1 | 2/2004 | Anthony et al. | | JP | 11-345273 | 12/1999 |
| 2004/0054426 A1 | 3/2004 | Anthony | | WO | WO 91/15046 | 10/1991 |
| 2004/0085699 A1 | 5/2004 | Anthony | | WO | WO 97/43786 | 11/1997 |
| 2004/0105205 A1 | 6/2004 | Anthony et al. | | WO | WO 98/45921 | 10/1998 |
| 2004/0130840 A1 | 7/2004 | Anthony | | WO | WO 99/04457 | 1/1999 |
| 2004/0218332 A1 | 11/2004 | Anthony et al. | | WO | WO 99/19982 | 4/1999 |
| 2004/0226733 A1 | 11/2004 | Anthony et al. | | WO | WO 99/37008 | 7/1999 |
| 2005/0016761 A9 | 1/2005 | Anthony, Jr. et al. | | WO | WO 99/52210 | 10/1999 |
| 2005/0018374 A1 | 1/2005 | Anthony | | WO | WO 00/16446 | 3/2000 |
| 2005/0063127 A1 | 3/2005 | Anthony | | WO | WO 00/65740 | 11/2000 |
| 2005/0248900 A1 | 11/2005 | Anthony | | WO | WO 00/74197 | 12/2000 |
| 2005/0286198 A1 | 12/2005 | Anthony et al. | | WO | WO 00/77907 | 12/2000 |
| 2006/0023385 A9 | 2/2006 | Anthony et al. | | WO | 01/06631 | 1/2001 |
| 2006/0139836 A1 | 6/2006 | Anthony | | WO | WO 01/10000 | 2/2001 |
| 2006/0139837 A1 | 6/2006 | Anthony et al. | | WO | WO 01/41232 | 6/2001 |
| 2006/0193051 A1 | 8/2006 | Anthony et al. | | WO | WO 01/41233 | 6/2001 |
| 2006/0203414 A1 | 9/2006 | Anthony | | WO | WO 01/45119 | 6/2001 |
| 2007/0019352 A1 | 1/2007 | Anthony | | WO | WO 01/71908 | 9/2001 |
| 2007/0047177 A1 | 3/2007 | Anthony | | WO | WO 01/75916 | 10/2001 |
| | | | | WO | WO 01/84581 | 11/2001 |
| | | | | WO | WO 01/86774 | 11/2001 |
| | | | | WO | WO 02/59401 | 1/2002 |

FOREIGN PATENT DOCUMENTS

| | | | | | |
|---|---|---|---|---|---|
| DE | 198 57 043 C1 | 3/2000 | WO | WO 02/11160 | 2/2002 |
| EP | 0623363 | 11/1994 | WO | WO 02/15360 | 2/2002 |
| EP | 98915364 | 11/1994 | WO | WO 02/33798 | 4/2002 |
| EP | 0776016 | 5/1997 | WO | WO 02/1227794 | 4/2002 |
| EP | 0933871 | 8/1999 | WO | WO 02/45233 | 6/2002 |
| EP | 1022751 | 7/2000 | WO | WO 02/65606 | 8/2002 |
| EP | 1024507 | 8/2000 | WO | WO 02/080330 | 10/2002 |
| EP | 1061535 | 12/2000 | WO | WO 03/005541 | 1/2003 |
| FR | 2765417 | 12/1998 | WO | WO 2004/070905 | 8/2004 |
| FR | 2808135 | 10/2001 | WO | WO 2005/002018 | 1/2005 |
| FR | 2808135 | 11/2001 | WO | WO 2005/015719 | 2/2005 |
| GB | 2217136 | 4/1988 | WO | WO 2005/065097 | 7/2005 |
| GB | 2341980 | 3/2000 | | | |
| JP | 63-269509 | 11/1988 | | | |
| JP | 1-27251 | 1/1989 | | | |
| JP | 01-120805 | 5/1989 | | | |
| JP | 01-212415 | 8/1989 | | | |
| JP | 02-267879 | 11/1990 | | | |
| JP | 03-018112 | 1/1991 | | | |
| JP | 03-71614 | 3/1991 | | | |
| JP | 5-283284 | 10/1993 | | | |
| JP | 05-299292 | 11/1993 | | | |
| JP | 06-053048 | 2/1994 | | | |

OTHER PUBLICATIONS

PCT International Search Report for PCT/US01/44681, Jan. 2, 2003.

Greb, "An Intuitive Approach to EM Fields," EMC Test & Design, Jan. 1991, pp. 30-33, Jan. 1, 1994.

Greb, "An Intuitive Approach to EM Coupling," EMC Test & Design, Dec. 1993, pp. 20-25, Dec. 1, 1993.

Sakamoto, "Noiseproof Power Supplies: What's Important in EMI Removal Filters?" JEE, Jun. 1986, pp. 80-85, Jun. 1, 1986.

Montrose, "Analysis on Loop Area Trace Radiated Emissions from Decoupling Capacitor Placement on Printed Circuit Boards," IEEE, 1999, pp. 423-428, Jan. 1, 1999.
Miyoshi, "Surface Mounted Distributed Constant Type Noise Filter," IEEE, 1999, pp. 157-160, Jan. 1, 1999.
Shigeta et al., "Improved EMI Performance by Use of a Three-Terminal-Capacitor Applied to an IC Power Line," IEEE, 1999, pp. 161-164, Jan. 1, 1999.
PCT International Search Report for PCT/US99/07653, Jul. 19, 1999.
IPER for PCT/US99/07653, Oct. 13, 1999.
U.S. Appl. No. 10/479,506, Claims 1-46 from Preliminary Amendment filed Dec. 10, 2003.
U.S. Appl. No. 10/189,339, Claims 1-41 from Preliminary Amendment filed Oct. 28, 2003.
U.S. Appl. No. 10/443,792, Claims 1-41 from Preliminary Amendment filed Oct. 28, 2003.
PCT International Search Report for PCT/US98/06962, Aug. 19, 1998.
PCT International Search Report for PCT/US99/01040, Apr. 19, 1999.
PCT International Search Report for PCT/US00/11409, Sep. 18, 2000.
PCT International Search Report for PCT/US00/14626, Sep. 13, 2000.
PCT International Search Report for PCT/US00/16518, Nov. 8, 2000.
PCT International Search Report for PCT/US00/21178, Dec. 28, 2000.
Fang et al., "Conductive Polymers Prolong Circuit Life," Design News, date unknown, 3 pages.
Carpenter, Jr. et al., "A New Approach to TVSS Design," Power Quality Assurance, Sep./Oct. 1996 p. 60-63, Sep. 1, 1996.
Raychem, "Polyswitch Resettable Fuses," Circuit Protection Databook, Jan, 1996, pp. 11-18, Jan. 1, 1996.
PCT International Search Report for PCT/US01/41720, Dec. 28, 2001.
PCT International Search Report for PCT/US01/09185, Jun. 13, 2001.
Polka et al., "Package-Level Interconnect Design for Optimum Electrical Performance," Intel Technology Journal Q3, 2000, pp. 1-17, Jul. 1, 2000.
PCT International Search Report for PCT/US01/43418, May 10, 2002.
PCT International Search Report for PCT/US01/32480, Mar. 13, 2002.
PCT International Search Report for PCT/US02/10302, Aug. 19, 2002.
PCT International Search Report for PCT/US02/21238, Feb. 28, 2003.
PCT International Search Report for PCT/US01/13911, Mar. 18, 2002.
PCT International Search Report for PCT/US91/02150, Jul. 16, 1991.
PCT International Search Report for PCT/US01/03792, Jun. 28, 2001.
"Johanson Dielectrics, Inc. Licenses X2Y Circuit Conditioning Technology," Press Release, Dec. 16, 1998, 1 page.
Beyne et al., "PSGA—an innovative IC package for single and multichip designs," Components, Mar. 1997, pp. 6-9, Mar. 1, 1997.
"EMC Design for Brush Commutated DC Electric Motors," Sep. 15, 1997, pp. 1-2.
"Tomorrow's Capacitors," Components, 1996, No. 4, p. 3, Apr. 1, 1996.
Mason, "Valor—Understanding Common Mode Noise," Mar. 30, 1998, pp. 1-7.
Anthony Anthony et al., Pending specification, claims, figures for U.S. Appl. No. 10/237,079, Claims 21-81; filed Sep. 9, 2002.
David Anthony et al., Pending specification, claims, figures of U.S. Appl. No. 10/766,000, Claims 1-63; filed Jan 29, 2004.
William Anthony, Pending specification, claims, figures for U.S. Appl. No. 10/399,630, Claims 1-35; filed Aug. 27, 2003.
Anthony Anthony et al., Pending specification, claims, figures for U.S. Appl. No. 10/432,840, Claims 1-39; filed May, 28, 2003.
William Anthony, Pending specification, claims, figures for U.S. Appl. No. 10/443,482, Claims 1-25; filed Jun. 12, 2003.
Anthony Anthony et al., Pending specification, claims, figures for U.S. Appl. No. 10/435,199, Claims 1-32; filed May 12, 2003.
Anthony Anthony et al., Pending specification, claims, figures for U.S. Appl. No. 10/115,159, Claims 1-31; filed Apr. 2, 2002.
Anthony Anthony et al., Pending specification, claims, figures for U.S. Appl. No. 10/189,338, Claims 1-69; filed Jul. 2, 2002.
Anthony Anthony et al., Pending specification, claims, figures for U.S. Appl. No. 10/189,339, Claims 1-41; filed Jul. 2, 2002.
Anthony Anthony et al., Pending specification, claims, figures for U.S. Appl. No. 10/479,506, Claims 1-46; filed Dec. 10, 2003.
Anthony Anthony, Pending specification, claims, figures for U.S. Appl. No. 10/443,764, Claims 26-40; filed Sep. 16, 2003.
Anthony Anthony, Pending specification, claims, figures for U.S. Appl. No. 10/443,792, Claims 1-41; filed May 23, 2003.
Anthony Anthony, Pending specification, claims, figures for U.S. Appl. No. 10/443,788, Claims 1; 21-45; filed May 23, 2003.
Anthony Anthony et al., Pending specification, claims, figures for U.S. Appl. No. 10/443,778, Claims 1; 21-59; filed May 23, 2003.
Anthony Anthony et al., Pending specification, claims, figures for U.S. Appl. No. 10/460,361, Claims 1-16; filed Jun. 13, 2003.
Anthony Anthony et al., Pending specification, claims, figures for U.S. Appl. No. 10/705,962, Claims 19-33; filed May 25, 2005.
Anthony Anthony, Pending specification, claims, figures for U.S. Appl. No. 10/369,335, Claims 1-20; Feb. 18, 2003.
Anthony Anthony et al., Pending specification, claims, figures for U.S. Appl. No. 09/647,648, Claims 1-48; filed Nov. 17, 2000.
Anthony Anthony, Pending specification, claims, figures for U.S. Appl. No. 10/328,942, Claims 1-20; filed Dec. 23, 2002.
Anthony Anthony et al., Pending specification, claims, figures for U.S. Appl. No. 09/632,048, Claims 1-20; filed Aug. 3, 2000.
Anthony Anthony et al., Pending specification, claims, figures for U.S. Appl. No. 09/996,355, Claims 1-73; filed Nov. 29, 2001.
Willian Anthony, Pending specification, claims, figures for U.S. Appl. No. 10/023,467, Claims 1-20; filed Dec. 17, 2001.
Weir, et al., "DesignCon 2005, High Performance FPGA Bypass Networks", Jan. 1, 2005.
Pending claims 1-40 and figures (3 pages) for U.S. Appl. No. 10/399,590; the specification is contained in WO 02/33798, filed Oct. 17, 2001, which is the published version of PCT/US01/32480, which is Neifeld Reference: X2YA0015UPCT-US, which is reference F-063 in the Information Disclosure Statement filed Apr. 23, 2004, Apr. 25, 2002.
PCT International Search Report for PCT/US04/00218, Feb. 11, 2005.
PCT International Search Report for PCT/US04/14539, Feb. 18, 2005.
Australian Patent Office Examination Report for SG 200303041-8; Neifeld Ref: X2YA0025UPCT-SG, Mar. 24, 2005.
PCT International Search Report for PCT/US04/18938, Apr. 11, 2005.
Muccioli, "EMC Society Seattle and Oregon Chapters—New X2Y Filter Technology Emerges as Singles Component Solution for Noise Suppression", Nov. 2000.
PCT Corrected IPER for PCT/US04/00218, Sep. 27, 2005.
Supplementary Partial European Search Report EP 99916477, Nov. 8, 2005.
Supplementary European Search Report EP 98915364, Oct. 27, 2005.
PCT ISR for PCT/US04/39777, Dec. 9, 2005.
EP Examination Report for 99916477.5-2215, May 8, 2006.
PCT International Search Report for PCT/US01/48861, Oct. 1, 2002.
PCT International Search Report for PCT/US01/44681, Jan. 2, 2003.
Greb, "An Intuitive Approach to EM Fields," EMC Test & Design, Jan. 1991, pp. 30-33, Jan. 1, 1994.
Greb, "An Intuitive Approach to EM Coupling," EMC Test & Design, Dec. 1993, pp. 20-25, Dec. 1, 1993.

Montrose, "Analysis on Loop Area Trace Radiated Emissions from Decoupling Capacitor Placement on Printed Circuit Boards," IEEE, 1999, pp. 423-428, Jan. 1, 1999.
PCT International Search Report for PCT/US99/07653, Jul. 19, 1999.
IPER for PCT/US99/07653, Oct. 13, 1999.
U.S. Appl. No. 10/479,506, Claims 1-46 from Preliminary Amendment filed Dec. 10, 2003.
U.S. Appl. No. 10/189,339, Claims 1-41 from Preliminary Amendment filed Oct. 28, 2003.
U.S. Appl. No. 10/443,792, Claims 1-41 from Preliminary Amendment filed Oct. 28, 2003.
PCT International Search Report for PCT/US98/06962, Aug. 19, 1998.
PCT International Search Report for PCT/US99/01040, Apr. 19, 1999.
PCT International Search Report for PCT/US00/11409, Sep. 18, 2000.
PCT International Search Report for PCT/US00/14626, Sep. 13, 2000.
PCT International Search Report for PCT/US00/16518, Nov. 8, 2000.
PCT International Search Report for PCT/US00/21178, Dec. 28, 2000.
Fang et al., "Conductive Polymers Prolong Circuit Life," Design News, date unknown, 3 pages.
Carpenter, Jr. et al., "A New Approach to TVSS Design," Power Quality Assurance, Sep./Oct. 1996, p. 60-63, Sep. 1, 1996.
Raychem, "Polyswitch Resettable Fuses," Circuit Protection Databook, Jan. 1996, pp. 11-18, Jan. 1, 1996.
PCT International Search Report for PCT/US01/41720, Of Record, Dec. 28, 2001.
PCT International Search Report for PCT/US01/09185, Jun. 13, 2001.
Polka et al., "Package-Level Interconnect Design for Optimum Electrical Performance," Intel Technology Journal Q3, 2000, pp. 1-17, Jul. 1, 2000.
PCT International Search Report for PCT/US01/43418, May 10, 2002.
PCT International Search Report for PCT/US01/32480, Mar. 13, 2002.
PCT International Search Report for PCT/US02/10302, Aug. 19, 2002.
PCT International Search Report for PCT/US02/21238, Feb. 28, 2003.
PCT International Search Report for PCT/US01/13911, Mar. 18, 2002.
PCT International Search Report for PCT/US91/02150, Jul. 16, 1991.
PCT International Search Report for PCT/US01/03792, Jun. 28, 2001.
"Johanson Dielectrics, Inc. Licenses X2Y Circuit Conditioning Technology," Press Release, Dec. 16, 1998, 1 page.
Beyne et al., "PSGA—an innovative IC package for single and multichip designs," Components, Mar. 1997, pp. 6-9, Mar. 1, 1997.
"EMC Design for Brush Commutated DC Electric Motors," Sep. 15, 1997, pp. 1-2.
"Tomorrow's Capacitors," Components, 1996, No. 4, p. 3, Apr. 1, 1996.

Mason, "Valor—Understanding Common Mode Noise," Mar. 30, 1998, pp. 1-7.
Anthony Anthony et al., Pending specification, claims, figures for U.S. Appl. No. 10/237,079, Claims 21-81; filed Sep. 9, 2002.
David Anthony et al., Pending specification, claims, figures for U.S. Appl. No. 10/766,000, Claims 1-63; filed Jan. 29, 2004.
William Anthony, Pending specification, claims, figures for U.S. Appl. No. 10/399,630, Claims 1-35; filed Aug. 27, 2003.
Anthony Anthony et al., Pending specification, claims, figures for U.S. Appl. No. 10/432,840, Claims 1-39; filed May 28, 2003.
William Anthony, Pending specification, claims, figures for U.S. Appl. No. 10/443,482, Claims 1-25; filed Jun. 12, 2003.
Anthony Anthony et al., Pending specification, claims, figures for U.S. Appl. No. 10/435,199, Claims 1-32; filed May 12, 2003.
Anthony Anthony et al., Pending specification, claims, figures for U.S. Appl. No. 10/115,159, Claims 1-31; filed Apr. 2, 2002.
Anthony Anthony et al., Pending specification, claims, figures for U.S. Appl. No. 10/189,338, Claims 1-69; filed Jul. 2, 2002.
Anthony Anthony et al., Pending specification, claims, figures for U.S. Appl. No. 10/189,339, Claims 1-41; filed Jul. 2, 2002.
Anthony Anthony et al., Pending specification, claims, figures for U.S. Appl. No. 10/479,506, Claims 1-46; filed Dec. 10, 2003.
Anthony Anthony, Pending specification, claims, figures for U.S. Appl. No. 10/443,764, Claims 26-40; filed Sep. 16, 2003.
Anthony Anthony, Pending specification, claims, figures for U.S. Appl. No. 10/443,792, Claims 1-41; May, 23, 2003.
Anthony Anthony, Pending specification, claims, figures for U.S. Appl. No. 10/443,788, Claims 1: 21-45; filed May 23, 2003.
Anthony Anthony et al., Pending specification, claims, figures for U.S. Appl. No. 10/443,778, Claims 1; 21-59; filed May 23, 2003.
Anthony Anthony et al., Pending specification, claims, figures for U.S. Appl. No. 10/460,361, Claims 1-16; filed Jun. 13, 2003.
Anthony Anthony et al., Pending specification, claims, figures for U.S. Appl. No. 10/705,962, Claims 1-18; filed Nov. 13, 2003.
Anthony Anthony, Pending specification, claims, figures for U.S. Appl. No. 10/369,335, Claims 1-20; Feb. 18, 2003.
Anthony Anthony et al., Pending specification, claims, figures for U.S. Appl. No. 09/647,648, Claims 1-48; filed Nov. 17, 2000.
Anthony Anthony, Pending specification, claims, figures for U.S. Appl. No. 10/328,942, Claims 1-20; filed Dec. 23, 2002.
Anthony Anthony et al., Pending specification, claims, figures for U.S. Appl. No. 09/632,048, Claims 1-20; filed Aug. 3, 2000.
Anthony Anthony et al., Pending specification, claims, figures for U.S. Appl. No. 09/996,355, Claims 1-73; filed Nov. 29, 2001.
William Anthony, Pending specification, claims, figures for U.S. Appl. No. 10/023,467, Claims 1-20; filed Dec. 17, 2001.
PCT International Search Report for International Application No. PCT/US01/47120 Dec. 28, 2001.
EP Examination Report for 99916477.5-2215, May 8, 2005.
Australian Examiner's First Report on Patent Application No: 2002320289; mailed Dec. 4, 2006.
Letter from Australian examiner dated Jan. 23, 2007 explaining error in citation contained in item O-096 from this reference citation; the correct reference is cited in this reference citation list: F-039.

* cited by examiner

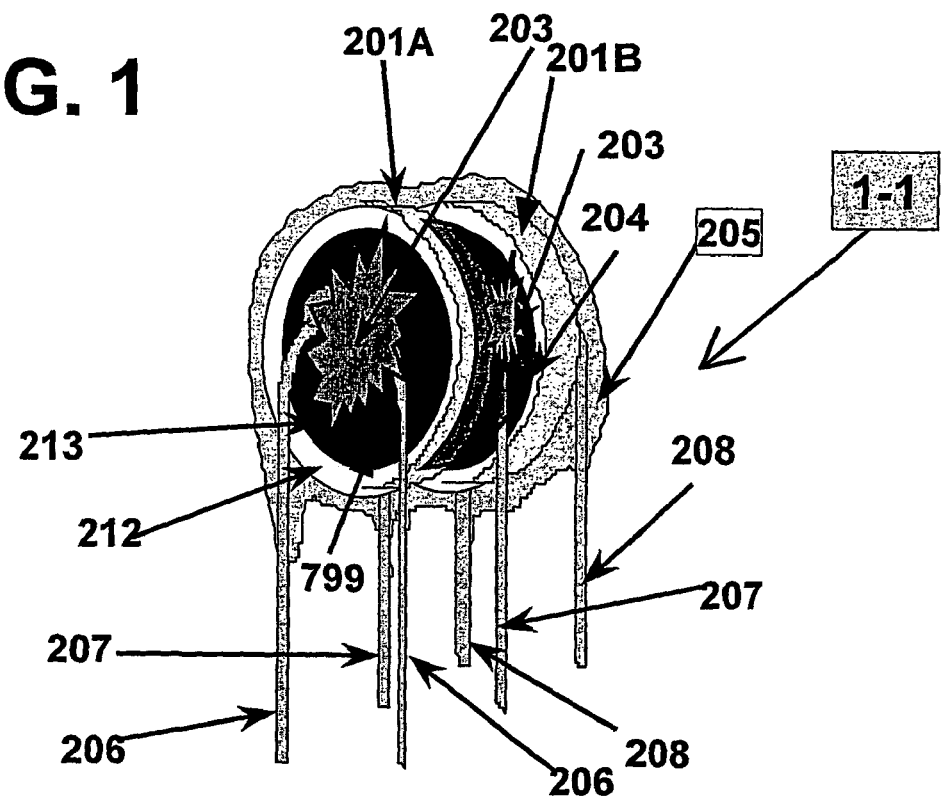
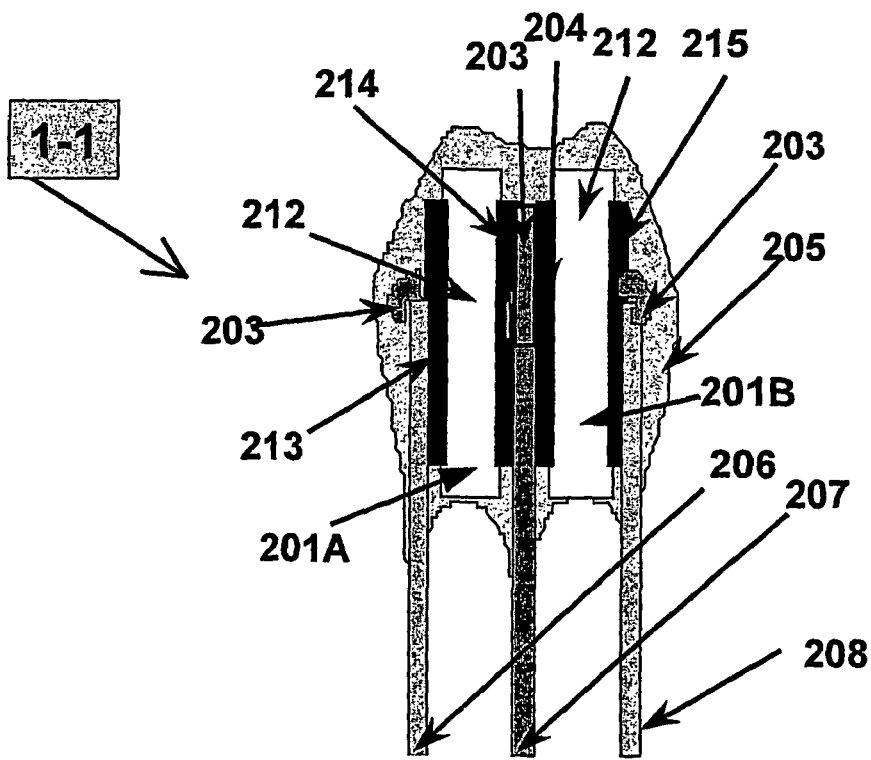

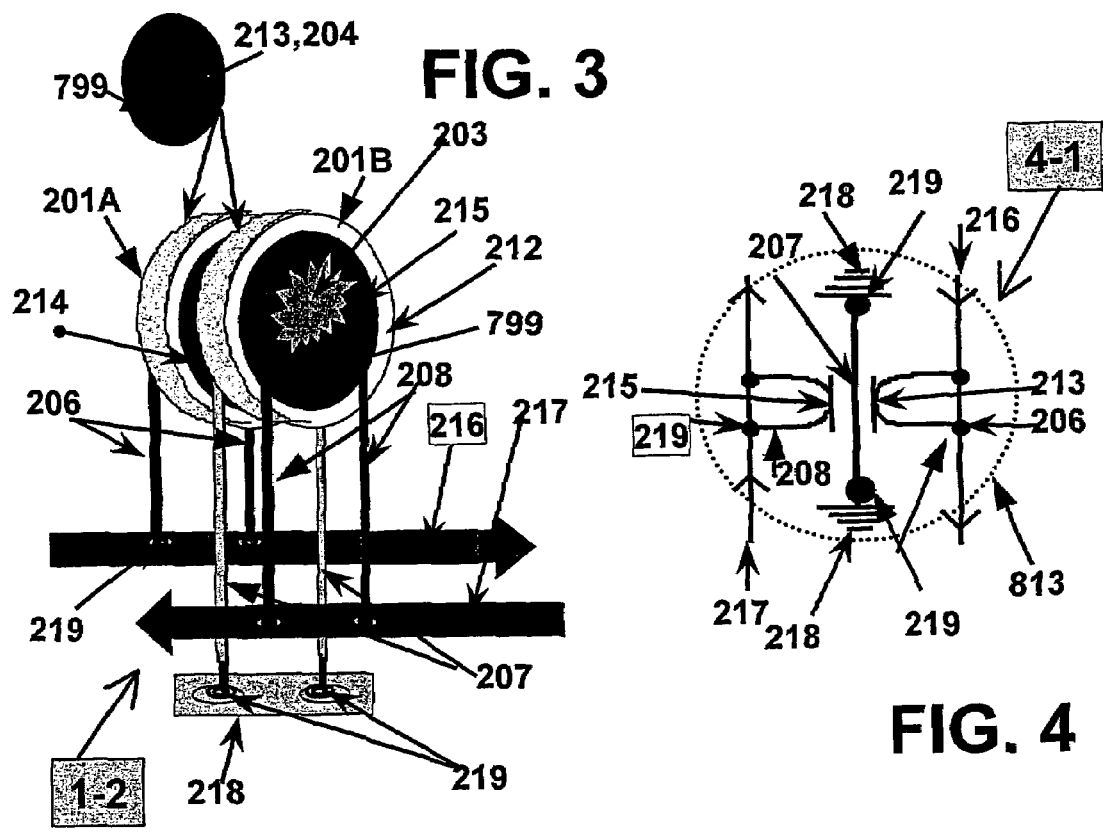
FIG. 3
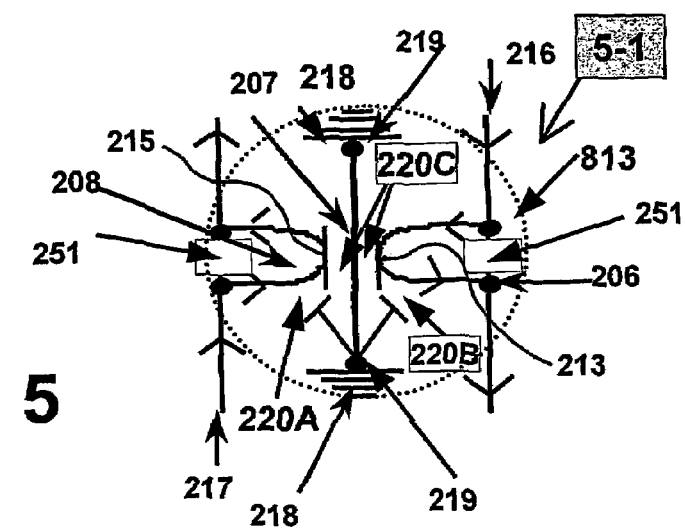
FIG. 4
FIG. 5

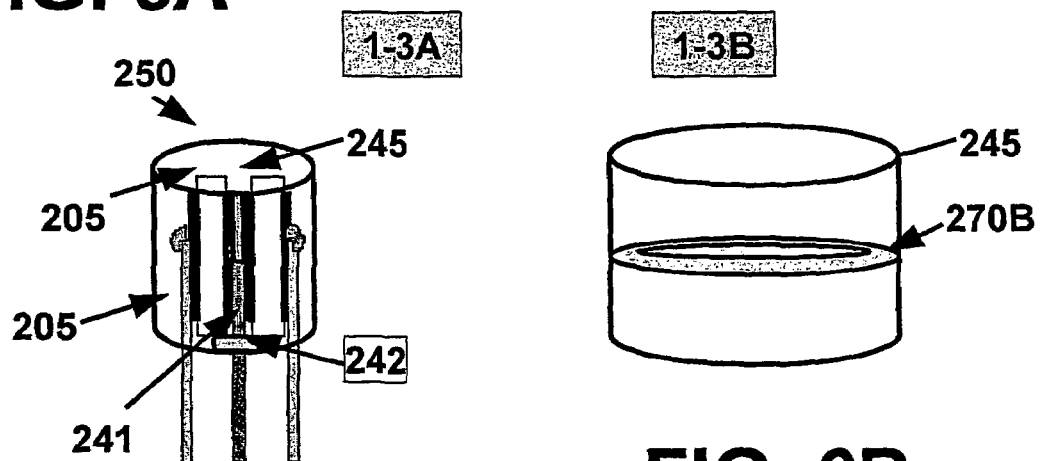
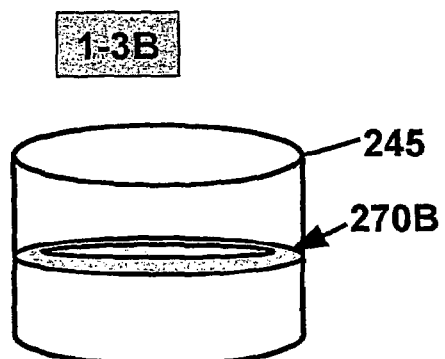

ELECTRODE ARRANGEMENT FOR CIRCUIT ENERGY CONDITIONING

This application is a US national stage application of international application PCT/US01/41720, filed Aug. 14, 2001, which claims the benefit under 35 U.S.C. 119(e) of U.S. Provisional Application No. 60/225,497, filed Aug. 15, 2000.

TECHNICAL FIELD

The new electrode arrangement relates to energy conditioning assemblies, electrode circuit arrangements, and a portioned electrode arrangement architecture. More specifically, the new electrode arrangement relates to a multi-functional electrode arrangement and shielding element for conditioning of propagating energy portions along energized conductive pathways or energized circuitry.

BACKGROUND OF THE INVENTION

Electrical systems have undergone short product life cycles over the last decade. A system built just two years ago can be considered obsolete to a third or fourth generation variation of the same application. Accordingly, passive componentry and circuitry built into these the systems need to evolve just as quickly. However, the evolvement of passive componentry has not kept pace. The performance of a computer or other electronic systems has typically been constrained by the frequency operating speed of its slowest active elements.

Passive componentry technologies have failed to keep up with these new breakthroughs and have produced only incremental changes in composition and performance. Advances in passive component design and changes have also focused primarily upon component size reduction, slight modifications of discrete component electrode portioning, dielectric discoveries, and modifications of embodiment manufacturing techniques or rates of production that decrease unit production cycle times.

At higher frequencies, energy pathways should normally be grouped or paired as an electrically complementary element or elements that work together electrically and magnetically in harmony and in balance within an energized system. Attempts to condition propagating energy portions with prior art componentry have led to increased levels of interference in the form of EMI, RFI, and capacitive and inductive parasitics. These increases can be due in part to imbalances and performance deficiencies of the passive componentry that create or induce interference into the associated electrical circuitry. These conditions have also created a new industry focus on passive componentry whereas, only a few years ago, the focus was primarily on the interference created by the active components from sources and conditions such as voltage imbalances.

Other disruptions to a circuit derive from large voltage transients, as well as ground loop interference caused by varying voltage or circuit voltage potentials. Certain existing transient or surge and EMI protection embodiments have been lacking in a need to provide adequate protection in one integrated package. Therefore, there remains a need in the art for a universally exploitable solution to overcome these and other deficiencies in certain prior art that is also cost effective and will have a longevity of usages despite the ever-increasing operating frequencies of future circuits.

The new electrode arrangement overcomes the disadvantages of certain prior art devices by providing a multi-functional, component electrode arrangement and shielding element for conditioning of propagating energy portions along conductive by-pass pathways or circuitry. The new electrode arrangement also possesses a commonly shared and centrally positioned energy pathway or electrode(s) that can in many cases, simultaneously shield and allow smooth energy interaction between grouped and energized pathway electrodes. The new electrode arrangement, when energized, will allow the contained energy pathways or electrodes to operate with respect to one another harmoniously, yet in an oppositely phased or charged manner, respectively.

Coupled selectively into a circuit and energized, the new electrode arrangement and other elements will utilize three isolated energy pathways within one integrated package in order to provide simultaneous EMI filtering and energy surge/energy transient protection and/or suppression while still maintaining an apparent even or balanced voltage supply between an energy source and an energy-utilizing load.

The new electrode arrangement will simultaneous and effectively provide energy conditioning functions that can include noise and/or energy bypassing, noise and/or energy filtering, energy decoupling, and/or energy storage. Variations of the new electrode arrangement use commonly found and accepted materials and methodologies for its production.

Today's passive component manufacturing infrastructure will be provided with an unprecedented ability to produce the new electrode arrangement through the usage of current equipment and machinery to allow for an ease of adaptability or production changeover for producing a new product that gives the end user improved final performance for circuitries as compared to certain prior art products.

SUMMARY OF THE INVENTION

It is an advantage of the present new electrode arrangement to provide three isolated energy pathways within one integrated package in order to provide simultaneous EMI filtering and energy surge/energy transient protection and/or suppression while still maintaining an apparent even or balanced voltage supply between an energy source and an energy-utilizing load and to allow conditioning of propagating energy portions along energy pathways or circuitry possessing a commonly shared and centrally positioned energy pathway or electrode that can simultaneously shield and allow smooth energy interaction between paired complementary energy pathways operating in electrically opposite manner with respect to each other.

It is another object of the new electrode arrangement to provide a low impedance energy pathway that will develop upon at least at least single isolated and separate, third energy pathway that was until now, not normally considered possible to now be integral in a single amalgamated grouping or structure for energized circuitry operations.

It is another object of the new electrode arrangement to provide an embodiment in the form of embodiments that form a multi-functioning electronic embodiment to provide a blocking circuit or circuits utilizing an inherent common energy pathway inherent to the embodiment, which is combined with an external conductive portion or "ground" area to provide coupling to an additional energy pathway from the paired energy pathway conductors for attenuating EMI and over voltages.

It is an object of the new electrode arrangement to be able to provide energy decoupling for active system loads while simultaneously maintaining a constant, apparent voltage potential and circuit reference node for that same portion of active componentry and its circuitry.

It is an object of the new electrode arrangement to provide an embodiment substantially free of the need of using additional discrete passive components to achieve the desired filtering and/or energy pathway conditioning that certain prior art components have been unable to provide.

It is an object of the new electrode arrangement to simultaneously minimize or suppress unwanted electromagnetic emissions resulting from differential and common mode currents flowing within electronic pathways that come under the new electrode arrangement influence.

It is an object of the new electrode arrangement to provide an embodiment giving the user an ability to realize an easily manufactured, adaptable, multi-functional electronic embodiment for a homogenous solution to a wide portion of the electrical problems and constraints currently faced when using certain prior art devices.

It is another object of the new electrode arrangement to provide an embodiment that utilizes standard manufacturing processes and be constructed of commonly found materials having predetermined properties and conductive or conductively made materials to reach tight capacitive tolerances between electrical pathways within the embodiment while simultaneously maintaining a constant and uninterrupted energy pathway for energy propagating from a source to an energy utilizing load.

Numerous other arrangements and configurations are also disclosed which implement and build on the above objects and advantages of the new electrode arrangement in order to demonstrate the versatility and wide spread application of a multi-functional, component electrode arrangement and its variations, all of which are within the scope of the present invention.

BRIEF DESCRIPTION OF THE DRAWINGS

FIG. 1 shows a perspective cut away view of a portion of the new electrode arrangement;

FIG. 2 shows a straight cut away view of a portion of the new electrode arrangement;

FIG. 3 shows a perspective cut away view of a portion of the new electrode arrangement with an in-circuit coupling depicted;

FIG. 4 shows a circuit depiction of an energized new electrode arrangement;

FIG. 5 shows an alternate circuit depiction of an energized electrode arrangement;

FIG. 6A shows a semi-transparent view of a portion of the embodiment shown in FIG. 2 now in combination with a conductive covering portion;

FIG. 6B shows a semi-transparent view of a conductive covering portion in FIG. 6A now in combination with a conductive coupling band portion; and FIG. 7 shows a straight cut away view of an alternate embodiment of the new electrode arrangement.

DETAILED DESCRIPTION OF EMBODIMENTS

The new electrode arrangement begins as a combination of electrically conductive, electrically semi-conductive, and non-conductive materials having predetermined properties, independent materials, portioned and arranged or stacked in various embodiments such as discrete elements. These portions can be combined to form a unique circuit when positioned and energized in a system. The new electrode arrangement embodiments include portions of electrically conductive, electrically semi-conductive, and non-conductive portions that form groups of common energy pathway electrodes, conductors, conductive deposits, conductive pathways (all can generally be referred to as 'energy pathways', herein), and the various material elements and combinations having one or more predetermined properties.

These invention portions are normally oriented in a parallel relationship with respect to one another and to a predetermined pairing or groups of conductive elements. These invention portions can also include various combinations of isolated energy pathways and their predetermined arrangement and portioning into a predetermined manufactured embodiment. These new electrode arrangement embodiments also have one or more predetermined properties formed into portions, multiple energy pathways, multiple common energy pathways, shields, sheets, laminates, or deposits in an interweaved arrangement of overlapping and non-overlapping methodologies that couples individual elements together for energization into a larger electrical system in a predetermined manner.

New electrode arrangement embodiments can exist as a un-energized, stand alone, embodiment that is energized with a combination, as a sub-circuit for larger circuitry found in other embodiments such as, but not limited to a circuit board, connector, electric motor, PCB (printed circuit board) or circuit board, multi-layered substrate or printed circuit substrate and the like.

When or after a structured portion arrangement is manufactured, it can be shaped, buried within, enveloped, or inserted into various electrical systems or other sub-systems to perform differentially phased, energy conditioning, decoupling, and/or aid in modifying a transmission of energy or energy portions into a desired energy form or electrical/energy shape.

By interposing complementary energy pathway electrodes with a centralized and shared, common energy pathway, which is subsequently conductively coupled or connected to a larger external area or same potentialed common energy pathway will, in most cases, in an energized system, become a 0-reference voltage or circuit portion for circuit voltages between two oppositely phased or potentialed, complementary energy pathways, of which are generally located on opposite sides of this centralized and shared, common energy pathway, energy pathways, or area extension.

The new electrode arrangement configuration and its variations are preconfigured to function for conditioning energy in a manner that significantly suppress and/or minimizing E-Fields and H-fields, stray capacitances, stray inductances, energy parasitics, and allowing for substantial mutual cancellation of oppositely phased and adjoining/abutting energy field portions propagating along variously coupled energy-in and energy-return pathways of a an energized circuit. A circuit board, connector, electric motor, PCB or circuit board, multi-layered substrate or printed circuit substrate and the like comprising energy pathways built with the new electrode arrangement and/or its variations can take advantage of various grounding schemes and techniques used now by large PCB or circuit board manufacturers.

To produce and propagate electromagnetic interference energy, two fields are required, an electric field and a magnetic field. Electric fields couple energy onto energy pathways or circuits through voltage differential between two or more points. Changing electrical fields in a space can give rise to a magnetic (H) field. Any time-varying magnetic flux will give rise to an electric (E) field. As a result, a pure electric or pure magnetic time-varying field cannot exist independent of each other.

Certain electrode arrangement architectures, such as utilized by the new electrode arrangement and/or its variations can be built to condition or minimize both types of energy fields that can be found in an electrical circuit system. While the new electrode arrangement and/or its variations is not necessarily built to condition one type of field more than another, it is contemplated that different types of materials with predetermined properties such as 212 and 799 "X" can be added or used to build an embodiment that could do such specific conditioning upon one energy field over another.

Use of the new electrode arrangement and/or its variations will allow placement into a differentially operated circuit or any paired differentially phased, energy pathway circuitry providing balanced or essentially, equalized capacitive tolerances, of one new electrode arrangement unit, that is shared and between each paired differentially phased, energy pathway, relatively equally, in an electrical manner.

As for all embodiments of the new electrode arrangement depicted and those not pictured, the applicant contemplates a manufacturer to have options in some cases for combining a variety and wide range of possible materials that can be selected and combined into a make-up of an new electrode arrangement and/or its variations when manufactured, while still maintaining some or all of a desired degree of electrical functions of the new electrode arrangement and/or its variations.

For a particular application, the thickness of a material 212 having varistor properties for example, or a material having predetermined properties 212 for another example may be modified easily to yield the desired amount of filtering, decoupling, and/or transient protection, as necessary. The particular construction also allows for simultaneous filtering of both differential mode and common mode energy, as well as protection against energy transients and other forms of electromagnetic interference over a large frequency range than is possible from the certain prior art.

Materials for composition of the new electrode arrangement embodiments can comprise one or more portions of material elements compatible with available processing technology and are generally not limited to any specific material having predetermined properties 212.

Equally so, the new electrode arrangement and/or its variations may comprise conductive materials of one or more portions of conductive compounds or material elements compatible with available processing technology and are generally not limited to any specific a material including, but not limited to, palladium, magnetic, ferro-magnetic or nickel-based materials, or any other conductive substances and/or processes that can create energy pathways for, or with, a conductive material, a conductive-resistive material and/or any substances or processes that can create conductive areas such as conductively doped, or doped for application of conductive materials. It should be noted that a resistive-conductive material or a resistive material (not shown) that comprises the plurality of electrodes or even a predetermined number of the plurality of electrodes is fully contemplated by the applicants. Electrodes, such as 213, 214, and 204, 215, respectively can be formed with the entire electrode pattern comprised of a resistive-conductive material or a resistive material. Other multi-portioned embodiments are contemplated wherein part of the internal electrode portions are formed comprising portions or combinations of conductive and resistive materials designated as 799 "X" (not shown) as opposed to electrodes formed from traditional 799 (not shown) conductive material or material combinations.

In this regard, this electrode material make-up is contemplated for substantially all embodiments of the electrode arrangement in bypass or even a feed-thru circuit configuration, as well. These materials may be a semiconductor material such as silicon, germanium, gallium-arsenide, or a semi-insulating or insulating material and the like such as, but not limited to any particular dielectric constant K.

Use of an electrode arrangement embodiment unit between energized, paired differentially phased, energy pathways rather than certain prior art units will alleviate the problem of circuit voltage imbalance or difference created by units of certain prior art introduced between a paired differentially phased, energy pathways, particularly at sensitive, high frequency operation.

New electrode arrangement tolerances or capacitive balance between a commonly shared central energy pathway found internally within the new electrode arrangement and/or its variations are generally maintained at levels that originated at the factory during manufacturing of the new electrode arrangement and/or its variations, even with the use of X7R dielectric, which is widely and commonly specified with as much as 20% allowable capacitive variation among any discrete units.

Thus, some of new electrode arrangement and/or its variations embodiments that are generally manufactured at 5% capacitive tolerance or less, for example, can be built closely as described in the disclosure will also have a correlated 5% capacitive tolerance or less measured between the differentially phased energy pathways or lines in an energized system and an added benefit exchanging two prior art devices for a single, paired energy pathway unit operating as complementary phased energy pathway pairing like 1-2, or one of the new electrode arrangement embodiment variants.

In bypass and/or decoupling circuit operations a symmetrical capacitive balance between two energy pathways that comprise energy pathways 217 and 216 exists by the utilizing of the third energy pathway elements as a fulcrum to function both as a common voltage divider during dynamic operations as well as physically dividing the capacitance equally and symmetrically (as is practicable using standard manufacturing practices) as is possible to allow this commonly shared fulcrum function to benefit each respective complementary energy pathway. Determining the relative capacitive balance found on either side of a common energy pathway 218 is measurable with today's standard capacitor component test measuring equipment. This new electrode arrangement provides users the opportunity to use an energy conditioning embodiment like 1-2 for that is homogeneous in conductive material make-up as well as homogeneous in any dielectric or material 212 make-ups as well, within a circuit. Now turning to FIGS. 1, 2, 3, 4, 5, 6A, 6B and 7, so that the applicants can move freely back in forth between all of the FIGS. 1, 2, 3, 4, 5, 6A, 6B and 7 to show and to describe all of the embodiment depictions as best they can.

Referring specifically now to FIGS. 1 and 2, an energy conditioning electrode arrangement 1-1 of the new electrode arrangement for use with energized circuitry and circuitry networks is shown. An electrode arrangement 1-1 is shown comprising a same conductive material 799 that can be of a standard or known material or combination of materials known suitable in the art for such applications. These electrodes numbered first electrode to fourth electrode as 213, electrode 214, electrode 204, and 215, respectively, can also be considered aligned in a manner where the perimeter edge of each electrode is evenly aligned with all the other perimeter edges of every other electrode of the arrangement such that they are considered superposed over one another irregardless of their relationship to the earth's horizon.

The first electrode 213 is placed in a position and followed by the second electrode 214, which is adjacent, the first electrode 231, and then the third electrode 204 is arranged adjacent to the second electrode 213. Then a fourth electrode 215 is positioned or arranged adjacent the third electrode 204 such that the first electrode 213 and the fourth electrode 215 are sandwiching the second electrode 214 and the third electrode 204 and other elements conductive coupling material 203 and electrode portion 207 which are all conductively coupled operable for common electrical operation together, yet while the first electrode 213 and the fourth electrode 215 are maintained conductively and thus, electrically isolated from both complementary electrodes, mainly, the second electrode 214 and the third electrode 204, while they themselves (213 and 215) are maintained conductively isolated from each other.

The energy conditioning electrode arrangement 1-1 comprises one material having one or more predetermined properties 212 are formed into at least two main-body electrode portioned assemblies 201A and 201B having electrodes 213, 214, and 204, 215, respectively, coupled thereto each side of each shaped portion of material having predetermined properties 212.

The shaped material having predetermined properties 212 are formed into a planar portion or wafer, laminate or other suitable shape. Electrodes 213, 214, 204, and 215 can be comprised of deposited conductive material standard or combination as state earlier suitable for such applications.

It should be noted that although not shown, interior positioned electrodes 214 and 204 can be slightly larger in diameter and main-body conductive area (not numbered) than the diameter and main-body conductive area size of each respective, complementary paired electrodes 213 and 215, respectively.

This size arrangement differential aids in the electrostatic shielding of respectively positioned complementary electrodes, 213 and 215 from one another's respective energy parasitics emissions that would otherwise attempt to couple upon each other during energized operation.

The smaller area main body electrode areas 80 (not fully shown) of electrodes 213 and 215 and the main body electrode portion 81s (not fully shown) of the 204 and 214 electrodes are positioned along the same imaginary axis center point or line (not shown) that would pass through the center portion of each respective electrode of this arrangement results in a relative insetting effect of the respective superposed main body electrode portion 80s of electrodes 213 and 215 positioned within the electrode area of the superposed electrode main-body areas 81 (not shown) of positioned electrodes 214 and 204.

It should be noted that the inset area 806 (though, not shown) with respect to the actual material having one or more predetermined properties 212 not covering a portion of all conductively portioned areas of electrodes 204 and 214, by positioned electrodes 214 and 204 should be similar, respectively to one another in make-up and size diameter as well as volume, (that standard manufacturing tolerances allow).

Configurations of the invention also offer minimization of conductive area size differentials between the respective superposed conductive material areas 799 that comprise the respective electrodes.

Uniformity of like sizes of various material portions or deposits are normally symmetrically balanced as stated earlier such that this symmetrical balance also will help provide a very tight capacitive and voltage balance for portions of energies located at a moment in time on either side of the central common electrode element 241/250 found within the area of energy convergence 813. Thus, a superposed electrode alignment of all electrodes of the three conductively isolated external pathways 216, 217 and 218 is fully contemplated to undergo usage for facilitating a substantially balanced and symmetrical division of portions of propagating energies moving in a reduced amount (voltage) along portions of the first complementary energy pathway 216, the second complementary energy pathway 217, symmetrical and complementary, yet on opposite sides of third energy pathway 218.

A differentially phased, energy pathway conditioning circuit with new electrode arrangement components like embodiment 1-2 may be used as a voltage dividing capacitor network, constructed in a manner to provide flat or planar-shaped portions, wafers, or laminates of a material having predetermined properties 212 for subsequent or eventual conductive deposit of electrode materials 799 or 799"X" on material 212 by standard manufacturing means known in the art. An alternative of voltage dividing, capacitive network embodiment 1-2 may be provided by coupling together various 212 materials with thin film materials, PET materials, materials 799"X" to be patterned into electrodes (not shown) formed thereon such that in their arranged or stacked in position the thin film materials, PET materials and the like, will provide the desired capacitance or inductive characteristics desired to achieve various desired simultaneous filtering response and/or transient response effects.

A circuit utilizing this variation of new electrode arrangement network could include a new electrode arrangement having an magnetic characteristic and function provided by predetermined materials 212 to increase the inductive characteristics of the invention such as through the use of a ferrite material or ferrite-electric or ferro-dielectric material (not shown) in almost any portion or combination that would be comprising the 212 material portion of the electrode arrangement. Use of ferro-materials that will further add to an invention variation so configured, the energy conditioning abilities or characteristics of such a circuit conditioning assembly comprised of an energized circuit, if desired.

When new electrode arrangement elements are formed into a complete embodiment like electrode arrangement 1-1, a commonly shared and centrally positioned electrode pairing of electrode 214 and electrode 204 with energy pathway electrode portion 207 and solder 203 or conductive coupling material 203 is found either combined, coupled to, fused, sintered, melded or any combination thereof for conductively coupling electrode 214 and electrode 204 to each other.

A circuit with the invention could include an energy source (not shown), an energy-using load (not shown), a first complementary conductive portion 216 coupled from a first side of two sides of the energy source to a first side of two sides of the energy-using load, a second complementary conductive portion 217 coupled from a second side of two sides of the energy-using load to a second side of two sides of the energy source. A separate conductive portion 218 is contemplated for the conductively/electrically isolated (isolated from 216 and 217) and yet, conductive coupling with conductive portions 219 and is used to couple the common shielding structure 241/250, comprising common electrodes 204 and 214 of any embodiment to separate conductive portion 218 for use as a pathway of low energy impedance that will develop at energization of the first and second complementary conductive portions 217 and 216, respectively.

Contiguous electrode portion 207 emerges from the embodiment in the form of what appears to be two separate elongations from within the embodiment 1-1. It is actually same contiguous unit of common energy pathway element 207 that is still structurally and electrically a uniform element.

This same type of electrode portion element makeup, construction or form and appearance of contiguous portion 207 coincides respectively with each complementary energy pathway contiguous electrode portions 208 and 206, respectively.

Contiguous electrode portion 207 can be positioned or located between commonly shared and centrally positioned electrode pairing of electrode 214 and electrode 204 within a sandwiched arrangement which conductively couple electrodes 214 and 204 to one another respectively, by either solder 203 with conductive coupling material 203 or solder-like methods, coupling or melding, pressure methodologies (not shown) or any other industry accepted practice.

The commonly shared and centrally positioned electrode pairings electrode 214 and electrode 204 are positioned and are sandwiched between externally positioned complementary electrodes 213 and 215. Electrodes 204 and 214 become a common electrode element that can also be used as a separate, third energy pathway 218. Third pathway 218 itself, is an isolated energy pathway from that of energy pathways 206 and 208 as mentioned earlier. A circuit coupled at 216, 217 by 219$s'$ (along with 218 external area coupled to common element portions 241/250 by 219$s'$) which are selective portions of the invention, will allow portions of energy utilizing the circuit (not shown) to propagate within an area of energy convergence 813 (not shown) found within the outline of an the new electrode arrangement. Such as circuit is normally electrically located between and servicing portions of energy propagating to and from an energy source and an energy utilizing-load such as a switch-mode power supply or an electric motor (both, not shown), for example.

It is also noted that insulating, non-conductive material potting or encapsulation or non-conductive coupling material 205 is of the standard industry material and can be applied by standard industry methods to be coupled around the invention elements of a typical energy conditioning electrode arrangement like embodiment 1-1, 1-2, etc. to complete this portion of a circuit assembly before the invention assembly is placed into and becomes part of an actual circuit energization. It is preferable to apply the coating 205 over a portion of the larger portion of whole element 1-1 shown in FIG. 2 to maintain the element 1-1's element integrity in a mounted position.

Embodiment 1-1 is conductively coupled with various predetermined portions of the three energy pathways to form embodiment 1-2 such that it comprises a first energy pathway 216 coupled by means of conductive coupling 219 that is coupled between a first portion of at least two portions of an energy source (not shown ) and a first portion of at least two portions of the energy utilizing load (not shown ). Energy pathway 217 in FIG. 3 is coupled between a second portion of the at least two portions of energy-utilizing load to a second portion of at least two portions of the energy source. The third energy pathway 218 which is conductively isolated both internally and externally from each conductively contiguous elements (such as 203, 205, 208, 219$s$ for pathway 217, for example) that are conductively coupled to pathway 216 and pathway 217, respectively for the circuit assembly show in FIG. 3 Third energy pathway 218 is independent of pathways 216 and 217 but is used in tandem with the circuit coupling result just described above, as needed and/or a predetermined by the need of a user or manufacturer.

It should be noted that use of a contiguous, dual lead-appearing configuration of electrode portions or electrode elements 206, as well as contiguous, dual lead-appearing configuration electrode portions 208, and 207 is generally preferred in terms of lowering overall energy pathway inductances for portions of an energized circuit (not all shown) comprising the new electrode arrangement, however it is noted that a single contiguous lead configuration of 206, 207 and 208 is also acceptable.

The contiguous electrode portion 207 will also enhance formation of a low impedance energy pathway created and found along the coupled together shielding energy elements 241/250 and can comprise elements 214 which is an electrode, conductive coupling material 203, electrode 204, conductive aperture or via or conductive coupling portion 219 (if desired or used) and of course energy pathway 218 which is a portion of the external third energy pathway, as disclosed.

The electrode element or contiguous electrode portion 207 can be the centrally located conductor contiguously coupled in a conductive manner between both the shielding electrodes 214 and 204, as well as any other shielding electrodes used (but, not shown) and will also be found to be the centrally located conductor of the electrode arrangement as a whole, as well.

Formation of a low impedance energy pathway normally occurs along pathway portions such as 207 during energization of the assembly and is normally found along this and other third energy pathway elements as just described due to interaction of energy portions propagating along various energy pathways such as 206 and 208 and electrodes 213 and 215, among others, as they, by their physical predetermined proximity and location, along with their predetermined conductive couplings allow energy conditioning to take place. Such a configuration will interactively enhance or electrically encourage a simultaneous and complementary energy portions to propagate independent of a direct conductive coupling to pathway 218 or 207 due to the state of condition created at energization and as described above to be conducive of a low impedance energy pathway now used to both block energy from returning as it moves (what is normally, unwanted) out along this third pathway in a manner harmonious to simultaneous energy conditioning functions.

The utilization of the internally and externally located shielding energy pathway will be described; as portions of energy propagating along paired complementary energy pathways undergo influence within the inventions' area of energy convergence 813, a portion of the energies can subsequently move out onto a common, externally located conductive areas or energy pathway such as 218 which are not of the complementary energy pathways 216 and 217 and thus, these portions of energy will be able to utilize this non-complementary energy pathway 218 as the energy pathway of low impedance for dumping and/or suppressing/blocking the return of unwanted EMI noise and energies from returning back into each of the respective energized complementary energy pathways 216 and 217. 216 and 217 receive symmetrical energy portions relative to the configuration of the balanced and symmetrical invention embodiment as a whole due to its make-up. This symmetrical energy portion conditioning is normally relative in terms of the balance of the various invention portions conductively coupled on either side of the fulcrum or shielding structure combination known as 241/250 (not shown in every FIG.) to them and separately on either side of the common third pathway or node utilized by the operating circuit.

Referring to FIG. 3, electrode 215 is shown conductively coupled to circuitry in a manner which will be described herein and can be applicable for all similar configurations, either common or complementary energy pathways with circuit coupling. Starting from a 203 coupling of the complementary electrode 215 for a specific example, first portion of 208 which could be of a first "leg" of complementary energy pathway 208 is conductively coupled at coupling point or conductive coupling portion 219 by standard means 203 known to the art in a manner to external energy pathway 217 at one or more locations depending on usage.

A second "leg" of complementary energy pathway 208 is conductively coupled at another coupling point or conductive coupling portion 219 by standard means 203 known to the art in a manner to external energy pathway 217 at one or more locations depending on usage.

Alternative variations of 1-2 could allow complementary energy pathway 208 to be twisted or fused together for a single coupling at couple point or conductive coupling portion 219 (not shown).

Complementary energy pathway 208 is conductively coupled to electrode 215 by the application of solder 203 or conductive coupling material 203 or conductive bonding agent in such a manner as to overlap one portion of the 208 energy pathway with the electrode 215 and to extend the remaining portions, outwardly away from electrode 215 in two portions, as shown.

Other energy pathways 217 and 216 and contiguous electrode portions 207 and 206 can be conductively coupled to each respective electrode in a similar manner as just described with 208 and 215 and 217.

A coupling scheme used for a circuit assembly as shown in FIG. 3 and both in FIG. 4 and FIG. 5, will be described. The circuit first will have an energy source, and an energy-utilizing load. The new circuit will normally allow a "0" voltage reference node on conductor 218 (not shown) to develop at energization with respect to each complementary conductor 216 and 217 which are located on opposite sides of the shared central and shielding energy pathway, pathway elements in a coupled combination 241/250 (which are electrode 214, conductive coupling material 203, electrode 204, and contiguous electrode portion 207, complementary energy pathway elements 206 and 208, if any), and an conductive portion 218 (as shown in FIG. 3).

FIGS. 4 and 5 depict circuit embodiments of the new electrode arrangement and/or its variations when energized to form by-pass circuit and/or feed-thru circuit modes which is the result of the various electrode patterning and in circuit couplings to form circuits that will both function as a simultaneous common mode and differential mode filter as well as a surge protection circuit usable but, not limited to switch mode power supplies, electric motors, telecommunication circuits (all not shown) between tip, ring and ground, which have in the past required one, two or sometimes three separate varistors to achieve the balanced protection desired or any other differentially phased or paired, multiple-paired systems circuitries. Balanced protection circuit of either embodiments 4-1 or 5-1 of the new electrode arrangement will ensure that a problem of unbalanced breakdown in most cases will not occur while not affecting normal ring voltage peaks occurring across the telephone conductors (not shown) for example.

Nevertheless, electrodes 213 and 215 coupled upon portions of a material having predetermined properties 212, respectively. The coupled shielding electrodes 214 and 204, along with common energy pathway or contiguous electrode portion 207, and a material having predetermined properties 212 positioned there between, will function as a portion of a balanced surge protection circuit for portions of propagating energy passing therethrough new electrode arrangement area of energy convergence 813 (not shown) of embodiments 1-1 or 1-2 and the like. In this way, surge protection portion of circuit 4-1 and 5-1 to third energy pathway 218 (shown in FIG. 3) by way of attachments or conductive coupling portions 219 and may be used wherein balanced protection for a circuit system is desired to be achieved.

It should be noted that in 5-1, the complementary circuit assembly comprising energy pathways 216 and 217, a non-conductive gap 251 is arranged to space-apart externally positioned pathways of the second complementary energy pathway 217 and first complementary energy pathway 216, as well. Thus, with respect to keeping conductive coupling portions 219 of the first complementary energy pathway 216 and keeping conductive coupling portions 219 of the second complementary energy pathway 217 separate through the utilization of non-conductive gap 251 in 5-1 an alternative circuit assembly configuration is shown. When present, the non-conductive gap 251 of new electrode arrangement embodiment and its circuit assembly variations are operable to be considered "bypassing" a majority of the portions of propagating energy within the various electrode arrangement embodiment's area of energy convergence 813 as seen in FIG. 5, so that embodiment 1-2 can be considered a bypass embodiment as it is known in the art.

Embodiment 4-1 of FIG. 4 shows a non-gapped 251 pathway set-up to allow a "by-passing of portions of energy" propagating along to pathway 208 and thus continue on pathway 217 or first complementary energy pathway 216 and leaving behind only the unwanted noise energy, which is drawn into the new electrode arrangement embodiment 4-1 area of energy convergence 813 to common conductive portion or third energy pathway 218 and within portions of 241/250 of the new electrode circuit arrangement and/or its variations area of energy convergence 813 and by way of the mutual cancellation or minimization effect of the positioning or arrangement of the various new electrode arrangement elements. The flexibility of the new electrode arrangement also provides a bypass/feed-through hybrid circuit mode for 5-1 to be utilized, if so desired. Thus, new electrode arrangement architecture utility is superior as to the choices allowed or available to a user over that of certain prior art.

The circuits as shown in FIGS. 4 and 5 represents dynamic-balanced circuit assembly portions or embodiments that also provide simultaneous surge protection in a circuit. It should be recognized that new electrode arrangement architecture embodiments as shown, are normally very small and compact and are easily arranged over electrical conductors or energy pathways or traces of almost any circuit to provide simultaneous energy decoupling, filtering of both common and differential mode noise energy and surge protection thereto.

As a further example of the new electrode arrangement and/or its variation utility, a voltage potential (not shown)

across the second complementary energy pathway 217 and the first complementary energy pathway 216, each relative to a common conductive portion or third energy pathway 218 (as shown in FIG. 3) is a given voltage or V1, and the potential (not shown) between these conductors and each respective side of the interposed common conductive portion or third energy pathway 218 (shown in FIG. 3) is now a given voltage V2 (not shown) and which is approximately half of the respectively of the voltage V1 potential and attributed to the second complementary energy pathway 217 and the first complementary energy pathway 216, each relative to a common conductive portion or third energy pathway 218 (as shown in FIG. 3) respectively, and is accomplished by interposing the new electrode arrangement, a material having predetermined properties 212 and energy pathway elements in a coupled combination 241/250 are electrode 214, conductive coupling material 203, electrode 204, and contiguous electrode portion 207 in a centrally arranged manner between complementary energy pathways 213 and 215 located externally on material 212.

Thus, for example an embodiment when energized becomes a phase balanced embodiment easily and economically achieved utilizing a material portion that could be up to 50% or more less in the thickness of MOV material Or material 212 that is normally disposed between electrodes 213 and 215, for example, and relative to the prior art when complementary pathway elements and in a coupled combination 241/250 are electrode 214, conductive coupling material 203, electrode 204, and electrode portion 207 to accommodate the voltage V2 as desired. It is of course recognized that the energy propagated along the assembly and external energy pathways in a combination configuration or location could be modified to reflect the voltage dividing relationship of voltages V1 and V2, respectively.

The novel electrode patterns of the new electrode arrangement embodiment 1-1 and/or its variations, etc. that are coupled thereon in conjunction with the material making up a material having predetermined properties 212 help to produce a commonality between electrodes or energy pathways, thereby producing a balanced and symmetrical circuit arrangement or network like 4-1 and 5-1 for a larger circuit.

Alternatively, or in conjunction with this type of differentially phased, energy conditioning circuit network 5-1 or 4-1, many material variations of the electrodes and the material having predetermined properties 212, as well as any ferro-magnetic, MOV combinations of materials, either non-conductive, and/or semi-conductive, and/or full conductive in nature, either made or utilized naturally or by processing or even doping may be constructed and used as the make up of the electrode and/or spaced-apart material used to electrically isolate electrodes of the invention electrode arrangement may be utilized in a similar manner for obtaining variations or even the same functionality results of a typical invention embodiment.

Normally, intimacy or commonality between complementary electrodes is not desirable, as all conductors carrying portions of propagating energy in circuits that are generally directly connected to a "ground" portion. In the new electrode arrangement, complementary interactive intimacy of complementary electrodes 213 and 215 is desirable Oust not direct conductive coupling) as the differentially phased, energy pathways of the conditioning circuits 5-1 and 4-1 are operable when these elements are electrically isolated from one another, yet positioned very close to one another as well to facilitate incoming and outgoing energy portions to come under influence of one another to allow complementary electrical interaction to occur. For example location of the configuration as apportion of a energy plug or I/O port or the like, so as to more effectively filter energy interference along these differentially operating energy pathways coupled to complementary electrodes 213 and 215, respectively.

Construction of the various new electrode arrangement circuits such as 4-1 and 5-1 allow simultaneous surge protection, filtering and decoupling of energy to take place within new electrode arrangement networks that are formed in a simple and miniaturized manner to provide an electrical plug, energy circuit, or other electrical circuit arrangement a needed multifunctional solution. New electrode arrangement circuitry utilizing these combined elements may be grouped into one package and are generally simply and easily constructed into the final electrical or electromechanical equipment to reduce labor and construction costs as well as to provide a miniaturized and effective circuit arrangement.

Additionally, the electrode arrangement architecture is for the most part so efficient that it allows faster clamping and recovery of energy then is possible for many MOV materials and thus standard dielectrics such as X7R can readily be substitute in place of MOV to accomplish almost identical transient energy handling capability in an energized circuit.

Coupling to an external conductive area 218 can include areas such as commonly described as a "floating", non-potential conductive area, a circuit system return, chassis or PCB or circuit board "ground" portion, or even an earth ground (all not shown). Through other functions such as cancellation or minimization of mutually opposing complementary energy pathway conductors 216 and 217, new electrode arrangement and/or its variations allow a low impedance pathway (not shown) to develop within the Faraday cage-like 241/250 unit like that shown in embodiment 1-3A of FIG. 6A or FIG. 6B or FIG. 7, although present, but not shown in circuits 5-1 and 4-1.

Embodiment 1-3A with respect to the enveloping conductive common shield conductive covering portion 245 and third energy pathway 218, the 1-3A unit as a whole, can subsequently continue to move energy out onto an externally located conductive area 218, thus completing an energy pathway of low impedance for unwanted EMI noise, if desired.

As depicted with new electrode arrangement conditioning circuit arrangement 5-1 shown in FIG. 5, new circuit embodiment 1-2 can be utilized wherein a desired capacitance value must be maintained for the filtering, and at the same time an increased voltage handling function is needed and thus created by the energy conditioning electrode arrangement of the new electrode arrangement embodiment and is effectively a surge clamp or surge protection embodiment, as well. One will note as in all embodiments selectively coupled into a predetermined circuit assembly arrangement as shown in FIG. 3 and FIG. 5 a symmetrical and balanced capacitive network is created that includes at least (2) energy pathway to GnD capacitors 220A and 220B are created between energy pathway 208 to GnD, (energy pathway 218) and one between energy pathway 206 to GnD (energy pathway 218, respectively), while (1) energy pathway to energy pathway capacitor 220C is created between energy pathway 206 and energy pathway 208, as well as.

A differentially phased, new electrode arrangement conditioning circuit arrangement 5-1 may be used in a larger system circuit arrangement wherein circuit arrangement 5-1 comprises at least one paired but differentially phased energy pathways coupled to the new electrode arrangement conditioning circuit arrangement made of a MOV (metal oxide varistor), an MOV/Ferrite material combination or any other MOV-type material which is constructed as a planar shaped portion or wafer having first and second parallel portions thereon.

Due to its larger diameter (or at least the same size electrode sizing) size in comparison to electrodes 213, 215, electrical coupling to third energy pathway 218 (like shown in FIG. 3) of the shielding structure 241/250 can be accomplished by soldering at one or preferably multiple points. This allows Faraday-like cage or shielded properties to begin and that function such that the total common shielding structure 241/250 that comprises the conductive covering portion 245, conductive coupling portion 270, contiguous electrode portion 207, conductive coupling materials 203, shielding electrodes 269A, 269B, 204 (if used) and/or 214 (if used) is operable to perform the unenergized shielding function as well as the energized electrostatic shielding function needed for minimization or suppression of energy parasitics attributed to the complementary conductive elements 213 and 215 of the new embodiment shown. For embodiments having the larger shielding electrodes the complementary conductive elements 213 and 215 are substantially inset and overlapped by the larger shielding electrodes 269A, 269B, 204 (if used) and/or 214 (if used).

Use of new electrode arrangement embodiments 1-1, 1-2, 1-3A, 1-3B, 4-1, 5-1, or any of their possible variations like 1-6 shown in FIG. 7, allow circuit voltage to be maintained and balanced even with SSO (Simultaneous Switching Operations) states among gates located within an integrated circuit (not shown) and without contributing disruptive energy parasitics back into the circuit system as the new electrode arrangement and/or its variations is passively operated, within said circuit system (not shown). With the use of FIG. 6A embodiments, parasitics of all types (not shown) are normally prevented or minimized from upsetting the capacitive or voltage balance that was manufactured into the unenergized new electrode arrangement and will be contrary to what occurs with every other prior art unit not using the conductive shield element 245 in combination with the other common elements to produce shielding structure 241/250. Certain prior art devices have failed to prevent the effects from free parasitics in both directions from disrupting a circuit despite the best attempts to the contrary.

FIG. 7 is another alternate embodiment 1-6, of the new electrode arrangement and is similar to embodiment 1-1 and 1-3A except that this embodiment has a majority of its electrode arrangement comprising at least a pair of shielded electrodes, all of substantially the same size and shape to each other and including, a first electrode 213 and a second electrode 215 that are complementary and superposed to each other. A plurality of shielding electrodes all of substantially the same size and shape to each other. This plurality of shielding electrodes is also included and are arranged superposed to one another such that a first shielding electrode 269A, a second shielding electrode 214, a third shielding electrode 204 and a fourth shielding electrode 269B will sandwich at least a pair of shielded electrodes, 213 and 215.

This plurality of shielding electrodes is also shown in FIG. 7 conductively coupled to each other by at least a conductive coupling portion or conductive coupling band 270A. This conductive coupling portion 270A is coupled by either by a resistive fit as partially shown from 270A to each shielding electrode in preferably at least two spaced-apart locations per shielding electrode, or (this is not shown) by a conductive material 203 through a soldering operation as is desired to provide conductive coupling from 270A to each shielding electrode in preferably at least two spaced-apart locations, as well. It is also noted that shielding electrodes 269A, 269B also do not have electrode lead portions and that these shielding electrodes rely on conductive coupling from 270A to provide the total conductive coupling to the other shielding electrodes 204 and/or 214 (if only one electrode is used as disclosed below). It is very important to note, that although not shown, the applicant contemplates a single shielding electrode, such as 204, placed in position without electrode 214 so as to suffice as a single central shielding electrode with electrode portion 207 coupled. This electrode 204 would then be considered both the central electrode of the overall electrode stack as well as the central electrode of the plurality of shielding electrodes. This configuration would provide a minimum (3) conductively coupled shielding electrode with the paired complementary electrodes 213 and 215 configuration versus the configuration shown in FIG. 7 of (4) conductively coupled shielding electrodes to the paired complementary electrodes 213 and 215.

It should also be noted that in all embodiments (although not shown) the first electrode 213 and the fourth electrode 215 of the at least one pair of complementary electrodes can be generally smaller than any one shielding electrode or any one shielding electrodes such as the second electrode 214 and the third electrode 204 of the common or shielding electrodes. This size differential between shielded electrodes 213 and 215 and the various shielding electrodes allows for the physical shielding of these complementary conductive pathways 213 and 215 to be accomplished just by the larger sized of the shielding conductive pathways or electrodes 214 and 204 and both the fifth electrode 269A of FIG. 7 and the sixth electrode 269B of FIG. 7, if used which is another variant of the invention embodiment.

Thus a shielding function is based on the relative size of the differentially conductive pathways to the larger shielding electrodes that in turn allow for energized, electrostatic shielding suppression or minimization of energy parasitics originating from the isolated but corresponding, complementary energy conductors 213 and 215, and substantially prevents them from escaping. In turn, the larger conductive covering 245 and the shielding electrodes as well as are preventing external energy parasitics not original to the contained complementary pathways from conversely attempting to couple on to the corresponding, shielded complementary energy pathways, sometimes referred to among others as capacitive coupling. Parasitic coupling is related to what is known as electric field ("E") coupling and this shielding function amounts to primarily shielding electrostatically against electric field parasitics. Parasitic coupling involving the passage of interfering propagating energies because of mutual or stray capacitances that originated from the complementary conductor pathways is suppressed within the new invention. The invention blocks parasitic coupling by substantially enveloping the oppositely phased conductors within Faraday cage-like conductive shield structures 245 and shielding electrodes pathways or shielding electrodes which are the second electrode 214 and the third electrode 204, as well as the fifth electrode 269A of FIG. 7 and the sixth electrode 269B of FIG. 7 that provide an electrostatic or Faraday shielding effect and with the positioning of the electrode layering and pre-determined electrode layering and conductive covering 245 position.

The first electrode 213 of the pair of shielded electrodes and the second electrode 215 of the pair of shielded electrodes are sandwiched by predetermined shielding electrodes of the plurality of shielding electrodes, respectively. The pair of shielded electrodes 213 and 215 is also conductively isolated from both the plurality of shielding electrodes and from each other within the electrode arrangement. Now, turning to FIG. 6A, new electrode arrangement embodiment 1-3A and/or its variations can be manufactured and subsequently coupled to two complementary energy pathways and an externally manufactured common conductive portion or third energy pathway 218 (shown in FIG. 3), separate from the complementary energy pathways 216 and 217 that can be also utilizing new electrode arrangement embodiment 1-3A and/or its variations, the new electrode arrangement will simultaneous provide energy conditioning functions that include bypassing, energy and power line decoupling, and, but not limited to energy storage, such that the complementary electrodes that are generally enveloped within shield embodiment 241/250 that are generally free from almost all, internally generated capacitive or energy parasitics (not shown) trying to escape from the enveloped containment area surrounding the energy pathway electrode and at the same time, will act to prevent any externally generated capacitive or energy parasitics such as "floating capacitance" or even "floating capacitance" from coupling onto the complementary energy pathways due to the physical shielding, separate of the electrostatic shield effect created by the energization of the common shielding embodiment 241/250 and its coupling with common means or conductive coupling portions 219 know to the art to an externally located conductive area 218 (shown in FIG. 3).

FIG. 6A is an alternate embodiment of the new electrode arrangement and depicted as 1-3A. Energy conditioning electrode arrangement 1-3A is similar to embodiment 1-1 except that embodiment 1-3A has a majority of its finished volume arranged within or into a conductive covering portion 245, which can be of any shape or size in order to operable as described below. Conductive covering portion 245 is secured to portions of common energy pathway combination 241/250 by standard means know in the art such as a resistive or tension fit and covered by portions of non-conductive material potting or encapsulation 205 which is arranged or placed around the electrode arrangement to provide protection and final protection of direct contact of the electrodes from non-arrangement portions of the outside world. Thus, FIG. 6A allows complementary energy pathway elements 213, 206, 208, 215 along with any other of their respective connecting conductive elements or conductive coupling portions like 219 to be insulated or isolated from electrical coupling to conductive covering portion 245.

Conductive covering portion 245 can also be electrically connected or coupled to common energy pathway combination 241/250 of having a larger diameter extending past material having predetermined properties 212 or by additional conductive coupling provided by other means (not shown) such as a monolithic conductive interposing embodiment. Due to its larger diameter in comparison to electrodes 206, 208, 213, 215, electrical coupling to third energy pathway 218 (shown in FIG. 3) can be accomplished by soldering at one or preferably multiple points. This allows Faraday-like cage or shielded properties to begin and that function such that conductive covering portion 245, contiguous electrode portion 207, conductive coupling material 203, electrode 214, electrode 204 complete most of the functions desired for minimization or suppression of energy parasitics attributed to the complementary conductive elements 213 and 215 of embodiment 1-3A. It also should be noted that conductive covering portion 245 can also itself have an outer coating (not shown) to insulate the outer portion of 245 as well to prevent direct electrical conductivity to or from non-arrangement portions of the outside world.

Not shown in FIG. 6A is any conductive covering portion 245 depicted with an internal conductive coupling portion 270B contiguously or subsequently conductively coupled to conductive covering portion 245 when it is made can also be another way to conductively couple the first shielding electrode 269A, the second or third shielding electrode 214 (depending upon configuration), the second or third shielding electrode 204 (depending upon configuration) and the third or the fourth shielding electrode 269B (depending upon configuration) to one another. Therefore, FIG. 6B is shown as an alternate conductive covering portion 245 for an embodiment of the new electrode arrangement and depicted in FIG. 7. Energy conditioning electrode arrangement 1-6 of FIG. 7 would have a majority of its finished volume arranged within conductive covering portion 245 as well. The conductive coupling portion 270B is shown coupled by either by a resistive fit as partially shown to conductive covering portion 245 or through a soldering operation as desired to provide conductive coupling from 270B to conductive covering portion 245 in preferably at least two spaced-apart locations. Conductive covering portion 245 is also covered by portions of non-conductive material potting or encapsulation 205 to allow 245's conductive coupling to the larger shielding electrodes 269A, 269B, 204 (if used) and 214 (if used) and conductive coupling portion 270 which is arranged or placed around the electrode arrangement to provide protection and final protection of direct contact of the electrodes from non-arrangement portions of the outside world. Conductive covering portion 245 can also itself have an outer coating (not shown) to insulate the outer portion of 245 as well. This allows substantial and almost complete enveloped shielding of complementary electrodes so that complementary energy pathway elements 213, 206, 208, 215 and their respective connecting conductive elements or conductive coupling portions 219 can be insulated or electrically isolated from electrical coupling to conductive covering portion 245 and the larger shielding electrodes 269A, 269B, 204 and 214.

Although conductive covering portion 245 can also be coupled to the total common energy pathway combination of the larger shielding electrodes 269A, 269B, 204 (if used) and 214 (if used), conductive coupling portion 270, as well as their conductive elements 203, 207, etc to form a shielding structure 241/250, it is noted that shielding electrodes 269A, 269B do not have electrode lead portions and that these shielding electrodes rely on covering 245 and common conductive portion 270 for conductive combination with 204 (if used) and/or 214 (if used).

As previously, noted, propagated electromagnetic interference can be the product of both electric and magnetic fields, respectively. The new electrode arrangement and/or its variations is capable of conditioning energy that uses DC, AC, and AC/DC hybrid-type propagation of energy along energy pathways found in an electrical system or test equipment. This includes use of the new electrode arrangement and/or its variations to condition energy in systems that contain many different types of energy propagation formats, in systems that contain many kinds of circuitry propagation characteristics, within the same electrical system platform.

In some variations depicted, principals of a Faraday cage-like shielding embodiment 241/250 are used when the shielding pathway element or combination conductive covering portion 245 of an electrode arrangement 1-2 is coupled to one or groupings of energy pathways, including conductive covering portion 245, coupling portion 242, electrode portion 207, third energy pathway 218 (shown in FIG. 3), together co-act with the larger, external conductive area or third pathway 218 (shown in FIG. 3) to electrostatically minimize or suppress radiated electromagnetic emissions and provide a greater conductive portion or area in which to dissipate over voltages and surges and initiate Faraday cage-like electrostatic suppression or minimization of energy parasitics and other transients, simultaneously, when a plurality of shielding energy pathways are normally electrically coupled to system or chassis "ground" (not shown) and is relied upon for reference "ground" 218 (shown in FIG. 3) for a circuit 4-1 or 5-1 of FIGS. 4 and 5 which is created when the electrode arrangement and/or its variations is arranged into a system and energized. As mentioned earlier, one or more of a plurality of materials 212 having different electrical characteristics can be inserted and maintained between shielding energy pathways and complementary energy pathways. Complementary elements 213 and 215 are normally separated electrically from one another and do not touch within the electrode arrangement and/or its variations.

Conductively coupled, internal common energy pathway combination 241/250, electrode 204, electrode portion 207, electrode 214, and conductive coupling material 203 along with conductive covering portion 245 that make up Faraday cage-like element as shown in FIG. 6A allow external conductive area or common conductive portion or third energy pathway 218 (shown in FIG. 3) to become, in essence, an extended, closely positioned, and essentially parallel arrangement of third energy pathway 218 by said conductive elements or common energy pathway combination 241/250 include electrode 204, electrode portion 207, electrode 214, coupling material 203, coupling portion 242, which couples to conductive covering portion 245 through non-conductive material 205 with respect to their position between an energy source and an energy-utilizing load, even if located internally within a pre-determined portioned PCB or circuit board or similar electronic circuitry at subsequent energization.

In all embodiments whether shown or not, the number of pathways, both shielding energy pathway electrodes and complementary energy pathway electrodes, can be multiplied in a predetermined manner to create a number of energy pathway element combinations, all in a generally physical parallel relationship that also be considered electrically parallel in relationship with respect to these elements in an energized existence with respect to a circuit source will exist additionally in parallel which thereby add to create increased capacitance values.

Secondly, additional shielding energy pathways surrounding the combination of center energy pathway elements in a coupled combination 241/250 are electrode 214, conductive coupling material 203, electrode 204, and a plurality of electrodes can be employed to provide an increased inherent "ground" with the utilization of a coupled common conductive shielding combination 241/250 for an optimized Faraday cage-like function and surge dissipation area in all embodiments.

Third, although a minimum of one common energy shielding embodiment 241/250 is made of in a coupled combination 241/250 are electrode 214, conductive coupling material 203, electrode 204 and paired with additionally positioned shielding energy pathway or shielding combination 241/250 is generally desired, the electrode arrangement requires positioned elements such that it allows energy to propagate evenly, if possible, on opposite sides of the common energy shielding combination 241/250 and in a coupled combination 241/250 are electrode 214, conductive coupling material 203, electrode 204 (other elements such as material having predetermined properties 212 and complementary electrodes can be located between these shields as described). Additional common energy pathways can be employed with any of the embodiments shown and is fully contemplated herein.

Finally, from a review of the numerous embodiments it should be apparent that the shape, thickness or size may be varied depending on the electrical application derived from the arrangement of common energy pathways, coupling elements that form at least one single conductively homogenous, Faraday cage-like element or utilized with other shielded energy pathways.

Although the principals, preferred embodiments and preferred operation of the new electrode arrangement have been described in detail herein, this is not to be construed as being limited to the particular illustrative forms disclosed. It will thus become apparent to those skilled in the art that various modifications of the preferred embodiments herein can be made without departing from the spirit or scope of the electrode arrangement and/or its variations as defined.

What is claimed:

1. An electrode arrangement comprising:
a pair of shielded electrodes that is complementary and superposed to each other including, a first shielded electrode and a second shielded electrode;
a plurality of shielding electrodes that are superposed to each other including at least a first shielding electrode, a second shielding electrode, and a third shielding electrode;
a common conductive coupling portion;
wherein the plurality of shielding electrodes are coupled to one another by at least the common conductive coupling portion;
wherein the first shielding electrode is in a first position;
wherein the first shielded electrode is in a second position adjacent the first shielding electrode;
wherein the second shielding electrode is in a third position adjacent the first shielded electrode;
wherein the second shielded electrode is in a fourth position adjacent the second shielding electrode;
wherein the third shielding electrode is in a fifth position adjacent the second shielded electrode;
wherein the first shielded electrode and the second shielded electrode are sandwiched by predetermined shielding electrodes of the plurality of shielding electrodes; and
wherein the pair of shielded electrodes are conductively isolated from both the plurality of shielding electrodes, and from each other.

2. An electrode arrangement comprising:
a plurality of electrodes that are superposed with one another including at least a first electrode, a second electrode, a third electrode, and a fourth electrode;
a plurality of material portions, wherein each material portion of the plurality of material portions has predetermined properties;
wherein the first electrode is adjacent to at least a first material portion of the plurality of material portions;
wherein the second electrode is adjacent to and spaced-apart from the first electrode by at least the first material portion of the plurality of material portions;
wherein the third electrode is adjacent to at least the second electrode;
wherein the fourth electrode is spaced-apart from and adjacent to the third electrode by at least a second material portion of the plurality of material portions;

wherein the second electrode and the third electrode are conductively coupled to each other;
wherein the first electrode and the fourth electrode sandwich the second electrode and the third electrode;
wherein the first electrode and the fourth electrode are conductively isolated from the second electrode and the third electrode; and
wherein the first electrode and the fourth electrode are conductively isolated from each other.

3. An electrode arrangement comprising:
a plurality of electrodes that are superposed with one another including at least a first electrode, a second electrode, a third electrode, and a fourth electrode;
a plurality of electrode portions including, a first electrode portion, a second electrode portion, and a third electrode portion;
   wherein the first electrode portion is coupled to the first electrode;
   wherein the second electrode portion is coupled to both the second electrode and the third electrode;
   wherein the third electrode portion is coupled to the fourth electrode;
a plurality of material portions, wherein each material portion of the plurality of material portions has predetermined properties;
wherein the first electrode is adjacent to at least a first material portion of the plurality of material portions;
wherein the second electrode is adjacent to and spaced-apart from the first electrode by at least the first material portion of the plurality of material portions;
wherein the third electrode is adjacent to at least the second electrode;
wherein the fourth electrode is spaced-apart from and adjacent to the third electrode by at least a second material portion of the plurality of material portions;
wherein the second and the third electrode are conductively coupled to each other;
wherein the first electrode and the fourth electrode are conductively isolated from the second electrode and the third electrode; and
wherein the first electrode and the fourth electrode are conductively isolated from each other.

4. An electrode arrangement comprising:
a plurality of electrodes that are superposed with one another including at least a first electrode, a second electrode, a third electrode, and a fourth electrode;
a plurality of material portions that are superposed with one another, wherein each material portion of the plurality of material portions has predetermined properties;
a plurality of electrode portions including, a first electrode portion, a second electrode portion, a third electrode portion;
wherein the first electrode portion is coupled to the first electrode, wherein the second electrode portion is coupled to both the second electrode and the third electrode, wherein the third electrode portion is coupled to the fourth electrode;
wherein the first electrode is in a predetermined position, wherein the second electrode is adjacent to and spaced-apart from the first electrode by a first material portion of the plurality of material portions, wherein the third electrode is spaced-apart from and adjacent to the second electrode, wherein the fourth electrode is adjacent to and spaced-apart from the third electrode by a second material portion of the plurality of material portions, wherein the second and the third electrode are conductively coupled to each other; and
wherein the first and the fourth electrode are conductively isolated from both the second and the third electrode, as well as from each.

5. The electrode arrangement according to claim 1 further comprising a plurality of material portions;
wherein each material portion of the plurality of material portions has predetermined properties; and
wherein each material portion of the plurality of material portions is operable to provide support of at least two electrodes of the plurality of electrodes.

6. A circuit including the electrode arrangement as in any one of the preceding claims.

7. The electrode arrangement as in one of claims 2-5, in which each material portion of the plurality of material portions is a material portion having at least dielectric properties.

8. The electrode arrangement as in one of claims 2-5, in which each material portion of the plurality of material portions is a material portion having at least ferro-magnetic properties.

9. The electrode arrangement as in one of claims 2-5, in which each material portion of the plurality of material portions is a material portion having at least metal oxide varistor properties.

10. The electrode arrangement as in one of claims 2-5, in which each material portion of the plurality of material portions is a material portion having any combination of ferrite properties and metal oxide varistor properties.

11. The electrode arrangement as in one of claims 2-5, in which each material portion of the plurality of material portions is a material portion having any combination of dielectric properties, ferrite properties and metal oxide varistor properties.

12. The electrode arrangement as in one of claims 2-5, in which the electrode arrangement is operable as a capacitor.

13. The electrode arrangement as in one of claims 2-5, in which the electrode arrangement is operable as an energy conditioner.

14. The electrode arrangement as in one of claims 2-5, in which the electrode arrangement is operable as portion of a capacitive network.

15. The electrode arrangement as in one of claims 2-5, in which the electrode arrangement is operable to provide at least three isolated energy pathways wherein at least one energy pathway of the three isolated energy pathways is a pathway of lowest impedance for energy.

16. A circuit assembly comprising:
a predetermined means for conditioning energy;
a circuit, including;
   an energy source;
   an energy-using load;
      a first complementary conductive portion coupled from the energy source to the energy-using load;
   a second complementary conductive portion coupled from the energy-using load to the energy source;
a common conductive portion;
a means for conductive coupling;
wherein the means for conductive coupling couples a first conductive portion of the predetermined means for conditioning energy to the first complementary conductive portion of the circuit;
wherein the means for conductive coupling couples a second conductive portion of the predetermined means for conditioning energy to the second complementary conductive portion of the circuit;

wherein the means for conductive coupling couples a third conductive portion of the predetermined means for conditioning energy to the common conductive portion; and wherein the first complementary conductive portion and the second complementary conductive portion are at least separated from one another.

17. The circuit assembly of claim 16 further comprising at least a portion of a capacitive network.

18. The circuit assembly of claim 16, wherein the energy-utilizing load is a switch-mode power supply.

19. The circuit assembly of claim 16, wherein the energy-utilizing load is an electric motor.

20. The circuit assembly as in one of claims 16-19, in which the predetermined means for conditioning energy is operable for combined differential mode and common mode filtering including a transient energy suppression function.

* * * * *